US008283751B2

(12) United States Patent
Kurjanowicz

(10) Patent No.: US 8,283,751 B2
(45) Date of Patent: Oct. 9, 2012

(54) SPLIT-CHANNEL ANTIFUSE ARRAY ARCHITECTURE

(75) Inventor: Wlodek Kurjanowicz, Ottawa (CA)

(73) Assignee: Sidense Corp., Ottawa, Ontario (CA)

(*) Notice: Subject to any disclaimer, the term of this patent is extended or adjusted under 35 U.S.C. 154(b) by 605 days.

(21) Appl. No.: 12/139,992

(22) Filed: Jun. 16, 2008

(65) Prior Publication Data
US 2008/0246098 A1    Oct. 9, 2008

Related U.S. Application Data

(63) Continuation of application No. 10/553,873, filed as application No. PCT/CA2005/000701 on May 6, 2005, now Pat. No. 7,402,855.

(60) Provisional application No. 60/568,315, filed on May 6, 2004.

(51) Int. Cl.
*H01L 23/52* (2006.01)
(52) U.S. Cl. ............... 257/530; 257/288; 257/E27.026; 257/E27.073
(58) Field of Classification Search .............. 257/530, 257/288; 438/131, 197
See application file for complete search history.

(56) References Cited

U.S. PATENT DOCUMENTS

| 3,423,646 | A | 1/1969 | Cubert et al. |
| 3,576,549 | A | 4/1971 | Hess et al. |
| 3,634,929 | A | 1/1972 | Yoshida et al. |
| 3,719,866 | A | 3/1973 | Naber et al. |
| 3,781,977 | A | 1/1974 | Hulmes |
| 3,877,055 | A | 4/1975 | Fisher et al. |
| 4,322,822 | A | 3/1982 | McPherson |
| 4,488,262 | A | 12/1984 | Basire |
| 4,490,900 | A | 1/1985 | Chiu |
| 4,495,693 | A | * | 1/1985 | Iwahashi et al. ............. 438/258 |

(Continued)

FOREIGN PATENT DOCUMENTS
EP        0089457 A    9/1983
(Continued)

OTHER PUBLICATIONS

European Patent Application No. 08772785.5 Search Report dated Dec. 7, 2010.

(Continued)

*Primary Examiner* — A. Sefer
(74) *Attorney, Agent, or Firm* — Shin Hung; Borden Ladner Gervais LLP

(57) ABSTRACT

Generally, the present invention provides a variable thickness gate oxide anti-fuse transistor device that can be employed in a non-volatile, one-time-programmable (OTP) memory array application. The anti-fuse transistor can be fabricated with standard CMOS technology, and is configured as a standard transistor element having a source diffusion, gate oxide, polysilicon gate and optional drain diffusion. The variable gate oxide underneath the polysilicon gate consists of a thick gate oxide region and a thin gate oxide region, where the thin gate oxide region acts as a localized breakdown voltage zone. A conductive channel between the polysilicon gate and the channel region can be formed in the localized breakdown voltage zone during a programming operation. In a memory array application, a wordline read current applied to the polysilicon gate can be sensed through a bitline connected to the source diffusion, via the channel of the anti-fuse transistor. More specifically, the present invention provides an effective method for utilizing split channel MOS structures as an antifuse cell suitable for OTP memories.

12 Claims, 12 Drawing Sheets

U.S. PATENT DOCUMENTS

| | | |
|---|---|---|
| 4,502,208 A | 3/1985 | McPherson |
| 4,507,757 A | 3/1985 | McElroy |
| 4,543,594 A | 9/1985 | Mohsen et al. |
| 4,546,273 A | 10/1985 | Osman |
| 4,599,705 A | 7/1986 | Holmberg |
| 4,611,308 A | 9/1986 | Lonky |
| 4,613,886 A | 9/1986 | Chwang |
| 4,677,742 A | 7/1987 | Johnson |
| 4,720,818 A | 1/1988 | Takeguchi |
| 4,758,745 A | 7/1988 | Elgamal |
| 4,758,986 A | 7/1988 | Kuo |
| 4,794,562 A | 12/1988 | Kato |
| 4,823,181 A | 4/1989 | Mohsen et al. |
| 4,870,302 A | 9/1989 | Freeman |
| 4,876,220 A | 10/1989 | Mohsen |
| 4,881,114 A | 11/1989 | Mohsen |
| 4,899,205 A | 2/1990 | Hamdy et al. |
| 4,943,538 A | 7/1990 | Mohsen |
| 4,962,342 A | 10/1990 | Mead |
| 5,008,721 A | 4/1991 | Gill et al. |
| 5,019,878 A | 5/1991 | Yang et al. |
| 5,029,130 A | 7/1991 | Yeh |
| 5,057,451 A | 10/1991 | McCollum |
| 5,068,696 A | 11/1991 | Yang et al. |
| 5,087,958 A | 2/1992 | Chen |
| 5,110,754 A | 5/1992 | Lowrey et al. |
| 5,138,410 A | 8/1992 | Takebuchi |
| 5,138,423 A | 8/1992 | Matsuo |
| 5,150,179 A | 9/1992 | Gill |
| 5,163,180 A | 11/1992 | Eltoukhy et al. |
| 5,241,496 A | 8/1993 | Lowrey et al. |
| 5,254,489 A | 10/1993 | Nakata |
| 5,258,947 A | 11/1993 | Sourgen |
| 5,303,185 A | 4/1994 | Hazani |
| 5,304,871 A | 4/1994 | Dharmarajan |
| 5,323,342 A | 6/1994 | Wada |
| 5,323,351 A | 6/1994 | Challa |
| 5,330,920 A | 7/1994 | Soleimani et al. |
| 5,331,181 A | 7/1994 | Tanaka |
| 5,396,465 A | 3/1995 | Oh |
| 5,401,993 A | 3/1995 | Yamauchi |
| 5,412,244 A | 5/1995 | Hamdy |
| 5,416,343 A | 5/1995 | Slotboom et al. |
| 5,422,505 A | 6/1995 | Shirai |
| 5,442,589 A | 8/1995 | Kowalski |
| 5,455,525 A | 10/1995 | Ho |
| 5,477,499 A | 12/1995 | Van Buskirk |
| 5,496,756 A | 3/1996 | Sharma |
| 5,502,326 A | 3/1996 | Slotboom |
| 5,550,773 A | 8/1996 | Woerlee |
| 5,561,315 A | 10/1996 | Van Dort |
| 5,576,568 A | 11/1996 | Kowshik |
| 5,578,848 A | 11/1996 | Kwong |
| 5,586,270 A | 12/1996 | Rotier |
| 5,587,603 A | 12/1996 | Kowshik |
| 5,595,922 A | 1/1997 | Tigelaar et al. |
| 5,600,265 A | 2/1997 | El Gamal |
| 5,646,438 A | 7/1997 | Frerichs |
| 5,650,336 A | 7/1997 | Eriguchi |
| 5,672,994 A | 9/1997 | Au et al. |
| 5,675,541 A | 10/1997 | Leterrier |
| 5,675,547 A | 10/1997 | Koga |
| 5,741,737 A | 4/1998 | Kachelmeier |
| 5,742,555 A | 4/1998 | Marr et al. |
| 5,745,417 A | 4/1998 | Kobayashi |
| 5,781,032 A | 7/1998 | Bertolet |
| 5,784,636 A | 7/1998 | Rupp |
| 5,786,268 A | 7/1998 | Gordon et al. |
| 5,798,552 A | 8/1998 | Alavi |
| 5,801,991 A | 9/1998 | Keeney et al. |
| 5,821,766 A | 10/1998 | Kim et al. |
| 5,825,069 A | 10/1998 | Wen et al. |
| 5,825,200 A | 10/1998 | Kolze |
| 5,825,201 A | 10/1998 | Kolze |
| 5,847,441 A | 12/1998 | Cutter |
| 5,880,512 A | 3/1999 | Gordon |
| 5,882,993 A | 3/1999 | Gardner et al. |
| 5,889,411 A | 3/1999 | Chaudhary |
| 5,892,962 A | 4/1999 | Cloutier |
| 5,899,732 A | 5/1999 | Gardner et al. |
| 5,909,049 A | 6/1999 | McCollum |
| 5,918,133 A | 6/1999 | Gardner et al. |
| 5,925,904 A | 7/1999 | Schmidt et al. |
| 5,929,482 A | 7/1999 | Kawakami |
| 5,949,712 A | 9/1999 | Rao |
| 5,963,799 A | 10/1999 | Wu |
| 5,986,931 A | 11/1999 | Caywood |
| 5,986,939 A | 11/1999 | Yamada |
| 5,999,450 A | 12/1999 | Dallabora |
| 6,016,268 A | 1/2000 | Worley |
| 6,031,761 A | 2/2000 | Ghilardelli |
| 6,034,893 A | 3/2000 | Mehta |
| 6,037,224 A | 3/2000 | Buller et al. |
| 6,040,968 A | 3/2000 | Duvvury |
| 6,047,243 A | 4/2000 | Bang |
| 6,064,225 A | 5/2000 | Andrews |
| 6,064,595 A | 5/2000 | Logie |
| 6,077,719 A | 6/2000 | Koike |
| 6,080,682 A | 6/2000 | Ibok |
| 6,084,428 A | 7/2000 | Kolze |
| 6,087,707 A | 7/2000 | Lee et al. |
| 6,096,580 A | 8/2000 | Iyer et al. |
| 6,097,077 A | 8/2000 | Gordon |
| 6,110,783 A | 8/2000 | Burr |
| 6,115,283 A | 9/2000 | Hidaka |
| 6,121,666 A | 9/2000 | Burr |
| 6,121,795 A | 9/2000 | Curd |
| 6,124,171 A | 9/2000 | Arghavani et al. |
| 6,127,235 A | 10/2000 | Gardner et al. |
| 6,134,144 A | 10/2000 | Lin |
| 6,136,674 A | 10/2000 | An et al. |
| 6,153,463 A | 11/2000 | Wei |
| 6,157,568 A | 12/2000 | Schmidt |
| 6,166,954 A | 12/2000 | Chern |
| 6,198,652 B1 | 3/2001 | Kawakubo |
| 6,214,666 B1 | 4/2001 | Mehta |
| 6,215,140 B1 | 4/2001 | Reisinger |
| 6,218,274 B1 | 4/2001 | Komatsu |
| 6,221,731 B1 | 4/2001 | Peng et al. |
| 6,229,733 B1 | 5/2001 | Male |
| 6,232,631 B1 | 5/2001 | Schmidt |
| 6,236,229 B1 | 5/2001 | Or-Bach |
| 6,249,809 B1 | 6/2001 | Bro |
| 6,266,269 B1 | 7/2001 | Karp |
| 6,282,123 B1 | 8/2001 | Mehta |
| 6,294,809 B1 | 9/2001 | Logie |
| 6,295,226 B1 | 9/2001 | Yang |
| 6,297,103 B1 | 10/2001 | Ahn |
| 6,304,666 B1 | 10/2001 | Warren |
| 6,335,262 B1 | 1/2002 | Crowder et al. |
| 6,337,250 B2 | 1/2002 | Furuhata |
| 6,351,428 B2 | 2/2002 | Forbes |
| 6,369,422 B1 | 4/2002 | Lojek |
| 6,396,120 B1 | 5/2002 | Bertin et al. |
| 6,400,632 B1 | 6/2002 | Tanizaki et al. |
| 6,420,925 B1 | 7/2002 | Fifield et al. |
| 6,421,293 B1 | 7/2002 | Candelier |
| 6,429,686 B1 | 8/2002 | Nguyen |
| 6,431,456 B2 | 8/2002 | Nishizawa |
| 6,445,619 B1 | 9/2002 | Mihnea |
| 6,456,535 B2 | 9/2002 | Forbes |
| 6,459,634 B1 | 10/2002 | Sher |
| 6,476,636 B1 | 11/2002 | Lien |
| 6,515,344 B1 | 2/2003 | Wollesen |
| 6,515,509 B1 | 2/2003 | Baxter |
| 6,531,410 B2 | 3/2003 | Bertin et al. |
| 6,545,899 B1 | 4/2003 | Derner et al. |
| 6,556,481 B1 | 4/2003 | Hsu |
| 6,569,101 B2 | 5/2003 | Quistgaard |
| 6,580,145 B2 | 6/2003 | Wu et al. |
| 6,597,234 B2 | 7/2003 | Reber et al. |
| 6,602,729 B2 | 8/2003 | Lin |
| 6,611,040 B2 | 8/2003 | Gelsomini et al. |
| 6,627,970 B2 | 9/2003 | Fuller et al. |
| 6,630,724 B1 | 10/2003 | Marr |
| 6,633,182 B2 | 10/2003 | Pileggi |
| 6,650,143 B1 | 11/2003 | Peng |

| | | | |
|---|---|---|---|
| 6,667,902 B2 | 12/2003 | Peng | |
| 6,671,040 B2 | 12/2003 | Fong et al. | |
| 6,674,670 B2 | 1/2004 | Jeung | |
| 6,678,646 B1 | 1/2004 | McConnell | |
| 6,682,980 B2 | 1/2004 | Chidambaram | |
| 6,700,151 B2 | 3/2004 | Peng | |
| 6,700,176 B2 | 3/2004 | Ito et al. | |
| 6,713,839 B2 | 3/2004 | Madurawe | |
| 6,714,450 B2 | 3/2004 | Bertrand | |
| 6,753,590 B2 | 6/2004 | Fifield et al. | |
| 6,754,881 B2 | 6/2004 | Kuhlmann | |
| 6,756,633 B2 | 6/2004 | Wang et al. | |
| 6,777,757 B2 | 8/2004 | Peng | |
| 6,808,985 B1 | 10/2004 | Lee et al. | |
| 6,812,122 B2 | 11/2004 | Bertin et al. | |
| 6,813,406 B2 | 11/2004 | Hatam-Tabrizi | |
| 6,829,169 B2 | 12/2004 | Ganivet | |
| 6,856,540 B2 | 2/2005 | Peng | |
| 6,862,205 B2 | 3/2005 | Agata | |
| 6,898,116 B2 | 5/2005 | Peng | |
| 6,903,984 B1 | 6/2005 | Tang | |
| 6,933,557 B2 | 8/2005 | Lojek | |
| 6,936,909 B2 | 8/2005 | Marr et al. | |
| 6,940,751 B2 | 9/2005 | Peng et al. | |
| 6,992,365 B2 | 1/2006 | Xu et al. | |
| 7,030,458 B2 | 4/2006 | Marr | |
| 7,087,499 B2 | 8/2006 | Rankin et al. | |
| 7,101,738 B2 | 9/2006 | Marr et al. | |
| 7,126,871 B2 | 10/2006 | Marr et al. | |
| 2001/0003374 A1 | 6/2001 | Bohmer | |
| 2001/0026494 A1 | 10/2001 | Marr | |
| 2002/0027822 A1 | 3/2002 | Candelier et al. | |
| 2002/0051399 A1 | 5/2002 | Tanizaki et al. | |
| 2002/0074616 A1 | 6/2002 | Chen et al. | |
| 2002/0185694 A1* | 12/2002 | Ooishi et al. | 257/393 |
| 2002/0192910 A1 | 12/2002 | Ramsbey | |
| 2003/0052320 A1 | 3/2003 | Tran | |
| 2003/0071315 A1 | 4/2003 | Peng | |
| 2003/0094608 A1 | 5/2003 | Abadeer | |
| 2003/0098495 A1 | 5/2003 | Amo et al. | |
| 2003/0109090 A1 | 6/2003 | Bertin et al. | |
| 2003/0202376 A1 | 10/2003 | Peng et al. | |
| 2003/0206467 A1 | 11/2003 | Peng et al. | |
| 2003/0207526 A1 | 11/2003 | Gelsomini | |
| 2003/0218234 A1 | 11/2003 | Madurawe | |
| 2003/0218920 A1 | 11/2003 | Harari | |
| 2004/0004269 A1 | 1/2004 | Fifield et al. | |
| 2004/0023440 A1 | 2/2004 | Ito et al. | |
| 2004/0065941 A1 | 4/2004 | Marr | |
| 2004/0076070 A1 | 4/2004 | Kim | |
| 2004/0135198 A1 | 7/2004 | Murahama | |
| 2004/0156234 A1* | 8/2004 | Peng et al. | 365/177 |
| 2006/0244099 A1 | 11/2006 | Kurjanowicz | |
| 2006/0292755 A1 | 12/2006 | Parris et al. | |

FOREIGN PATENT DOCUMENTS

| | | |
|---|---|---|
| EP | 0295935 | 12/1988 |
| JP | 61292295 | 12/1986 |
| JP | 1015966 | 1/1989 |
| JP | 4-44273 | 2/1992 |
| JP | 6132501 | 5/1994 |
| JP | 08-213483 | 8/1996 |
| JP | 2000-077627 | 3/2000 |
| KR | 20010030493 | 4/2001 |
| WO | 03025944 A1 | 3/2003 |
| WO | 2004003966 | 1/2004 |
| WO | 2005109516 A1 | 11/2005 |

OTHER PUBLICATIONS

PCT/CA2008/001122: International Search Report dated Sep. 18, 2008.
U.S. Appl. No. 11/762,552 Notice of Allowance, dated Apr. 28, 2010.
European Patent Application No. 05743122.3: search report dated Jul. 2, 2009.
International Search Report dated Sep. 18, 2008 from International Application PCT/CA2008/001122.
U.S. Appl. No. 11/877,229 Notice of Allowance dated Oct. 14, 2009.
English Translation of Korean Patent Application No. 2006-7025621 Office Action dated May 18, 2011.
English Abstract of Japanese Application JP-A-2002-093745, published Mar. 29, 2002, Matsushita Electric Ind. Co. Ltd.
English Abstract of Japanese Application JP-A08-213483, published Aug. 29, 1996, Deutscheitt Ind. GmbH.
English Abstract of Japanese Application JP-A-08-172138, published Jul. 2, 1996, Advanced Micro Devices Inc.
English Abstract of Japanese Application JP-A-2002-319674, published Oct. 31, 2002, International Business Machine Corp.
English Abstract of Japanese Application JP-A-03-220767, published Sep. 27, 1991, Sharp Corp.
Japanese Patent Application No. 2007-511808, English Translation of Office Action dated May 20, 2011.
U.S. Appl. No. 12/814,124, Notice of Allowance dated May 13, 2011.
U.S. Appl. No. 101553,873, Office Action dated May 14, 2008.
European Patent Application No. 05743122.3, Office Action dated Jun. 23, 2010.
Alam et al. "A Study of Soft and Hard Breakdown—Part I: Analysis of Statistical Percolation Conductance," IEEE Transactions on Electron Devices, 49:232-238 (Feb. 2002).
Alam et al. "A Study of Soft and Hard Breakdown—Part II: Principles of Area, Thickness, and Voltage Scaling," IEEE Transactions on Electron Devices, 49:239-246 (Feb. 2002).
Crupi et al. "A Novel Methodology for Sensing the Breakdown Location and Its Application to the Reliability Study of Ultrathin Hf-Silicate Gate Dielectrics," IEEE Transactions on Electron Devices 52:1759-1768 (Aug. 2005).
Degraeve et al. "A Consistent Model for the Thickness Dependence of Intrinsic Breakdown in Ultra-Thin Oxides," IEEE International Electron Devices Meeting, pp. 863-866 (1995).
Degraeve et al. "Relation Between Breakdown Mode and Location in Short-Channel nMOSFETs and Its Impact on Reliability Specifications," IEEE Transactions on Device and Materials Reliability 1:163-169 (Sep. 2001).
Esquivel "High Density Contactless, Self Aligned EPROM Cell Array Technology," IEEE International Electron Devices Meeting, pp. 592-595 (1986).
Ghani et al., 100nm Gate Length High Performance / Low Power CMOS Transistor Structure, IEEE International Electron Devices Meeting, pp. 415-418 (1999).
Gill et al. "A 5-Volt Contactless Array 256Kbit Flash EEPROM Technology," IEEE International Electron Devices Meeting, pp. 428-431 (1988).
Kaczer et al. "Consistent Model for Short-Channel nMOSFET After Hard Gate Oxide Breakdown," IEEE Transactions on Electron Devices 49:507-513 (Mar. 2002).
Ko et al. "The Effects of Weak Gate-to-Drain(Source) Overlap on MOSFET Characteristics," IEEE International Electron Devices Meeting, pp. 292-295 (1986).
Lee "A Capacitance-Based Method for Experimental Determination of Metallurgical Channel Length of Submicron LDD MOSFET's," IEEE Transactions on Electron Devices 41:403-4112 (Mar. 1994).
Ogura et al. "A Half Micron MOSFET Using Double Implanted LDD," IEEE International Electron Devices Meeting pp. 718-721 (1982).
Shur "Split-Gate Field Effect Transistor," Applied Physics Letters 54:162-164 (Jan. 1989).
Weir, B.E., et al., Ultra-Thin Gate Dielectrics: They Break Down, but Do They Fail?, IEEE International Electron Devices Meeting, pp. 73-76 (1997).
Wong "Sidewall Oxidation of Polycrystalline-Silicon Gate," IEEE Electron Device Letters 10:420-422 (Sep. 1989).
Wu et al. "Structural Dependence of Dielectric Breakdown in Ultra-Thin Oxides and Its Relationship to Soft Breakdown Modes and Device Failure;" IEEE International Electron Devices Meeting pp. 187-1990 (1998).
Yang et al. "Asymmetric Gate (AG) FET: Sub-micron MOS Device Structure With Excellent performance," Proceedings, 6th Intern. Conf. on Solid State and Integrated Circuits Technology pp. 543-546 (2001).

Kim et al., "3-Transistor Cell OTP ROM Array Using Standard CMOS ate-Oxide Antifuse", Journal of Semiconductor Technology and Science, vol. 3, No. 4, Dec. 2003, 6 pages.

Wu, E.W. et al; Voltage-Dependent Voltage-Acceleration of Oxide Breakdown for Ultra-Thin Oxides; IEEE, 2000.

Sune, Jordi et al; Post Soft Breakdown Conduction in SiO2 Gate Oxides; IEEE, 2000.

DeGraaf, C., et al. A Novel High-Density Low-Cost Diode Programmable Read Only Memory, IEEE, 1996.

Rasras, Mahmoud et al; Substrate Hole Current Origin After Oxide Breakdown; IEEE, 2000.

Lombardo, S. et al; Softening of Breakdown in Ultra-Thin Gate Oxide nMOSFET's at Low Inversion Layer Density; 39th Annual International Reliability Physics Symposium; Orlando, FL 2001.

Miranda, Enrique et al; Analytic Modeling of Leakage Current Through Multiple Breakdown Paths in SiO2 Films; 39th Annual International Reliabiligy Physics Symposium; Orlando, FL 2001.

* cited by examiner

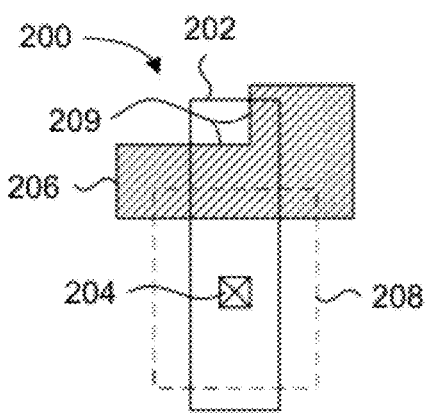
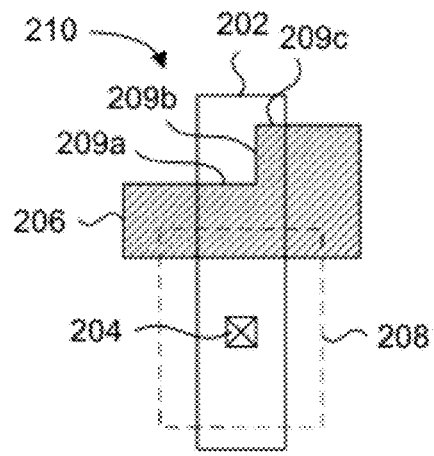
Figure 6a            Figure 6b
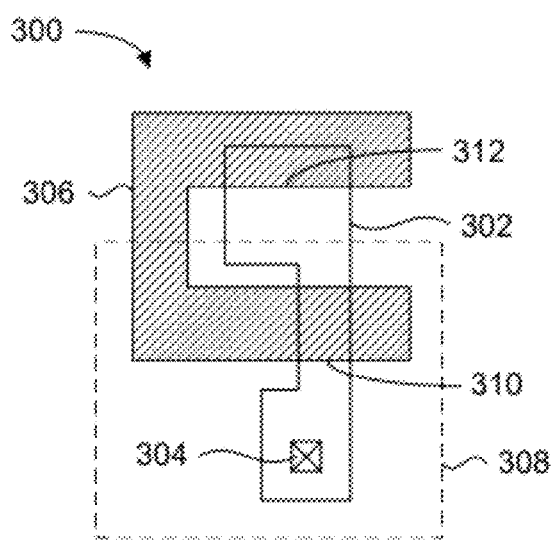
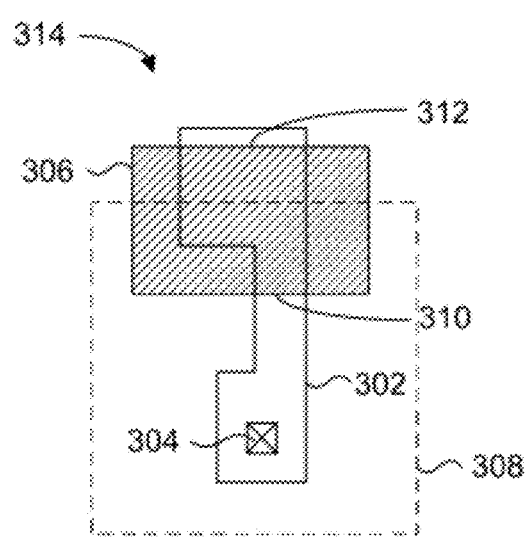
Figure 7a            Figure 7b

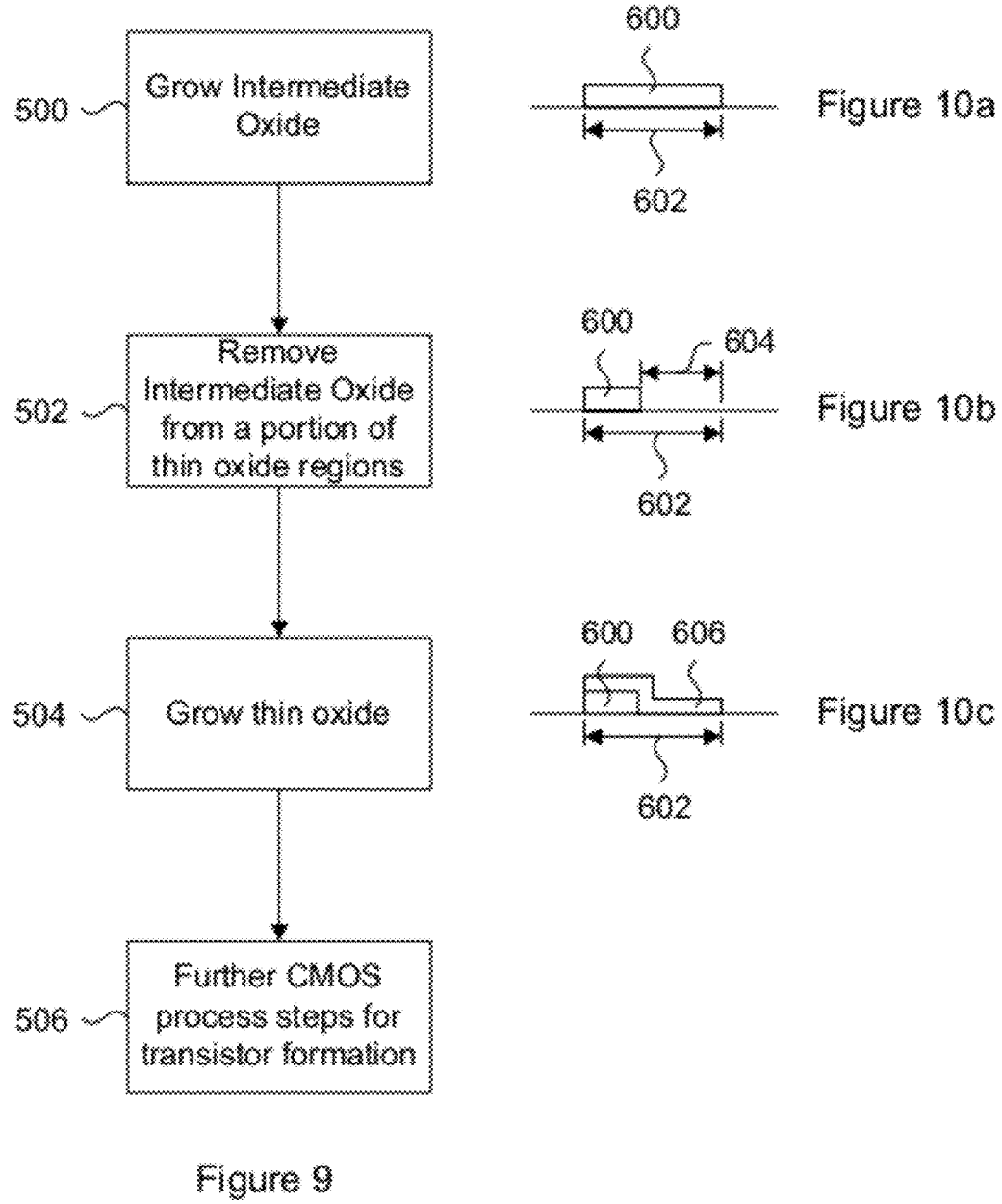

SPLIT-CHANNEL ANTIFUSE ARRAY ARCHITECTURE

CROSS REFERENCE TO RELATED APPLICATIONS

This application is a Continuation application of U.S. patent application Ser. No. 10/553,873 filed on Oct. 21, 2005, now issued as U.S. Pat. No. 7,402,855 on Jul. 22, 2008, which is a National Stage Entry of PCT Application Serial Number CA2005/000701 filed on May 6, 2005, which claims the benefit of priority of U.S. Provisional Patent Application No. 60/568,315 filed May 6, 2004, which is incorporated herein by reference.

FIELD OF THE INVENTION

The present invention relates generally to non-volatile memory cells. In particular, the present invention relates to split-channel anti-fuse transistors.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in microelectronic industry, but the most successful anti-fuse applications to date can be seen in FGPA devices manufactured by Actel and Quicklogic, and redundancy or option programming used in DRAM devices by Micron.

A summary of the progression of anti-fuse development follows as evidenced by issued United States patents.

Anti-fuse technology development started with U.S. Pat. No. 3,423,646, which disclosed a thin film formable diode PROM built as an array of horizontal and vertical conductors with a thin dielectric (aluminium oxide) between the conductors, at their crossings. Such NVM memory was programmed through perforation of the dielectric in some of the crossings. A formable diode would act as an open circuit until a voltage of sufficient magnitude and duration is applied to the crossing to cause forming of the aluminum oxide intermediate layer at which time device would act as a tunnelling diode.

U.S. Pat. No. 3,634,929 disclosed an inter-metal semiconductor anti-fuse array, the structure of the anti-fuse consisting of a thin dielectric capacitor (AlO2, SiO2 or Si3N4) utilizing two (Al) conductors located above and connected to the semiconductor diode.

A programmable dielectric ROM memory structure using a MOS capacitor and a MOS switching element was shown in U.S. Pat. No. 4,322,822 (McPherson). This cell was formed as a standard gate-oxide-over-substrate capacitor having a gate connected to a MOS transistor using a buried contact. In order to lower the oxide breakdown voltage, which needed to be smaller for the anti-fuse capacitor then for the MOS switch, a V-shaped grove in the capacitor area was proposed. Since the capacitor was formed between the poly gate and the grounded p-type substrate, the rupture voltage had to be applied to the capacitor through an access transistor. The Gate/Drain and Gate/Source edges of the access transistors were located at the second field oxide, much thicker then the gate oxide in the channel area, which greatly improved Gate/S-D breakdown voltage.

U.S. Pat. No. 4,507,757 (McElroy) proposed a method for lowering gate oxide breakdown voltage through avalanche junction breakdown. Although the original McElroy ideas evolved around using gated diodes to locally induce avalanche breakdown, which in turn lowered dielectric rupture voltage by enhanced electron tunnelling, he actually introduced or embodied other and perhaps more important elements to anti-fuse technology: (a) Dual gate oxide anti-fuse: access transistor gate oxide thicker then anti-fuse dielectric. McElroy's dual gate oxide process steps are: initial gate oxidation, etching areas for thinner gate oxide and subsequent gate oxidation. This procedure is now used in standard CMOS technologies for "I/O" and "1T" devices. (b) A "common-gate" (planar DRAM like) anti-fuse connection where access transistor connects to anti-fuse diffusion (Drain) node and all the anti-fuse gates are connected together. This is opposite to McPherson arrangement and results in much denser cell since the buried contact is eliminated. (c) Limiting resistor between common anti-fuse gate and external ground. (d) Two-terminal anti-fuse MOS device (a half transistor): McElroy concluded that only two terminals are needed in anti-fuse capacitor: D and G. The Source is not really needed for anti-fuse programming or operation and can be fully isolated from the active area. The bulk connection does not play any role either except for the avalanche breakdown. So the source role is limited to collecting carriers from the avalanche breakdown should the local substrate potential increase to forward bias the emitter of a parasitic n-p-n device formed by D, B and S.

It wasn't until 1985 when U.S. Pat. No. 4,543,594 (Mohsen) proposed an anti-fuse design suitable for redundancy repair. As such application requires much lower density than PROM, it was easier to supply external high voltage necessary to rupture the oxide without actually passing this voltage through the access transistors. Mohsen's anti-fuse structure consisted of a thin oxide (50-150 A SiO2) polysilicon capacitor over a doped region. He believed that silicon from the substrate or silicon from the electrode where a polysilicon electrode is used melts into pin holes in the insulative layer to provide the conductor, and his test data showed that where the oxide layer is approximately 100 A thick and has an area between 10 to 500 um$^2$, fusion occurred at a voltage of 12 to 16 volts. The current required to cause this fusion is less than 0.1 uA/um2 of capacitor area, and the resulting fused link has a resistance of approximately 0.5 to 2K ohms. A link, once fused, can handle currents of up to 100 milliamps at room temperature for approximately one second before it heals to an open fuse. Taking into account electron migration wear-out, the predicted wear-out lifetime of a link, once fused, is substantially greater than 3E8 hours.

The possibility of anti-fuse self-healing under current stress appeared to be the main roadblock for application of this technology in such areas like PROMs, PLDs and FPGAs, where constant fuse stress was required. The anti-fuse healing problem was resolved later by Mohsen and others at Actel in U.S. Pat. No. 4,823,181. Actel teaches the way to implement a reliable programmable low impedance anti-fuse element by using an ONO structure instead of silicon dioxide. Actel's method required an ohmic contact after dielectric rupture. This was achieved either by using heavily doped diffusion, or by putting an ONO dielectric between two metal electrodes (or silicide layers). The necessity of an Arsenic doped bottom diffusion electrode was revised later in U.S. Pat. No. 4,899,205, where it was allowed for either top-poly or bottom-diffusion to be highly doped.

U.S. Pat. No. 5,019,878 taught that if the drain is silicided, the application of a programming voltage in the range of ten to fifteen volts from the drain to the source reliably forms a melt filament across the channel region. A gate voltage may be applied to control the specific transistors to melt. IBM discovered similar effect by proposing a channel anti-fuse in U.S. Pat. No. 5,672,994. They discovered that with 0.5 um technology, the BVDSS for the nmos transistor is not only in the order of 6.5V, but once the S-D punch through occurs it creates permanent damage resulting in few kilo ohms leakage between the source and the drain.

U.S. Pat. Nos. 5,241,496 and 5,110,754 to Micron, disclosed a DRAM cell based anti-fuse (trench and stack). In 1996, Micron introduced a well-to-gate capacitor as an anti-fuse in U.S. Pat. No. 5,742,555. U.S. Pat. No. 6,087,707 proposed an N-Well coupled anti-fuse as a way to eliminate undercut defects associated with polysilicon etching. U.S. Patent Application No. 2002/0027,822 proposed a similar anti-fuse structure, but with n+ regions removed to create an asymmetrical ("unbalanced") high voltage access transistor using the N-well as a drain electrode.

U.S. Pat. No. 6,515,344 proposed a range of P+/N+ anti-fuse configurations, implemented using a minimum size gate between two opposite type diffusion regions.

NMOS anti-fuses have been built in an isolated P-well using a standard Deep N-Well process. An example of Deep N-Well based anti-fuses is disclosed in U.S. Pat. No. 6,611,040.

U.S. Patent Application Nos. 2002,0074,616 and 2004,0023,440 disclose other Deep N-Well anti-fuses. These anti-fuses consisted of a capacitor featuring direct tunnelling current rather then Fowler Nordheim current. These applications confirm that anti-fuse performance is generally improved for thinner gate oxide capacitors (approx 20 A, which is typical for transistors in 0.13 um process).

U.S. Pat. No. 6,580,145 disclosed a new version of a traditional anti-fuse structure utilizing dual gate oxides, with the thicker gate oxide being used for nmos (or pmos) access transistors and the thinner gate oxide for the capacitor. The N-Well (or P-Well) is used as a bottom plate of the anti-fuse capacitor.

The idea of creating a source drain short through the gate by separately breaking the S-G and D-G dielectric regions of the transistor is disclosed in U.S. Pat. No. 6,597,234.

U.S. Patent Application No. 2004,0004,269 disclosed an anti-fuse built from a MOS transistor having gate connected to the gate of a capacitor, degenerated by a thinner gate oxide and heavy doping under the channel through additional implantation (a diode). The rupture voltage is applied to a bottom plate of the capacitor.

In U.S. Pat. No. 6,667,902 (Peng) Peng attempts to improve a classic planar DRAM-like anti-fuse array by introducing "row program lines" which connect to the capacitors and run parallel to the word lines. If decoded, the row program lines can minimize exposure of access transistors to a high programming voltage, which would otherwise occur through already programmed cells. Peng and Fong further improve their array in U.S. Pat. No. 6,671,040 by adding a variable voltage controlling programming current, which allegedly controls the degree of gate oxide breakdown, allowing for multilevel or analog storage applications.

Most recently, U.S. Patent Application No. 2003/0202376 (Peng) shows a memory array using a single transistor structure. In the proposed memory cell, Peng eliminates the LDD diffusion from a regular NMOS transistor. A cross-point array structure is formed of horizontal active area (S/D) stripes crossing vertical poly gate stripes. Drain contacts are shared between neighbouring cells and connected to horizontal wordlines. Source regions are also shared and left floating. Peng assumes that if the LDD diffusion is omitted, the gate oxide breakdown location will be far enough from the drain area and a local N+ region will be created rather than D-G (drain-gate) short. If such a region was created, the programmed cells could be detected by positively biasing the gate and sensing the gate to drain current. In order to reduce the G-D or S-D (source-drain) short probability, Peng proposes increasing gate oxide thickness at the G-D and S_D edges through modification of a gate sidewall oxidation process. Peng's array requires that both source and drain regions be present in the memory cells, row wordlines coupled to transistor drain regions, and the column bitlines formed from transistor gates. Such an unusual connection must be very specific to Peng's programming and reading method, requiring a decoded high voltage (8V in 1.8V process) applied to all drain lines except for the one to be programmed. The decoded high voltage (8V) is applied to the gates of the column to be programmed, while the other gates are kept at 3.3V.

Although Peng achieves a cross-point memory architecture, his array requires CMOS process modifications (LDD elimination, thicker gate oxide at the edge) and has the following disadvantages: (a) All row decoders, column decoders and sense amplifiers must switch a wide range of voltages: 8V/3.3V/0V or 8V/1.8V/0V. (b) During a program operation, the 3.3V column drivers are effectively shorted to 8V row drivers or 0V drivers through programmed cells. This puts many limits on the array size, affects driver size and impacts reliability and effectiveness of programming. (c) Every program operation requires that all the array active areas (except for the programmed row) are biased at 8V. This leads to large N++ junction leakage current, and again limits array size. (d) The gate oxide breaking spot is assumed to be located far enough from the drain area so the punch through is not happening at 8V bias. At the same time, the transistor must operate correctly at 1.8V biasing—connecting to the channel area. This is not achievable without significant process modification. (e) Peng assumes that the gate oxide will not break on the source or drain edge if the LDD is not present. It is however known in the art that the S/D edges are the most likely locations for the oxide breakdown because of defects and electric field concentration around sharp edges.

Peng attempts to solve some of the high voltage switching problems in U.S. Patent Application No. 2003/0206467. The high blocking voltage on wordlines and bitlines is now replaced with "floating" wordlines and bitlines, and restrictions on the distance from the channel to the source and drain regions has been changed. Although floating wordlines and bitlines may ease problems with high voltage switching, they do not solve any of the above mentioned fundamental problems. Additionally they introduce severe coupling problems between the switched and the floating lines.

Today, anti-fuse developments concentrate around 3-dimensional thin film structures and special inter-metal materials. All these anti-fuse technologies require additional processing steps not available in standard CMOS process, prohibiting anti-fuse applications in typical VLSI and ASIC designs, where programmability could help overcome problems with ever shrinking device life cycles and constantly rising chip development costs. Therefore there is an apparent need in the industry for a reliable anti-fuse structures utilizing standard CMOS process.

All the prior art anti-fuse cells and arrays either require special processing steps or suffer from high voltage exposure of MOS switching elements, leading to manufacturability and reliability problems. They are also limited to low density memory applications, with the exception of Peng's single transistor cell, which in turn has very doubtful manufacturability.

It is, therefore, desirable to provide a simple and reliable, high density, anti-fuse array architecture suitable for implementation in standard CMOS technology, without any additional processing steps and with limited over-voltage exposure of switching elements. It is also desirable to provide a testing method for the anti-fuse arrays to be effectively tested prior to shipment and permanent programming in the field or during manufacturing process. It is further desirable to simplify and improve such test and programming access to the anti-fuse arrays during manufacturing process.

SUMMARY OF THE INVENTION

It is an object of the present invention to obviate or mitigate at least one disadvantage of the previous anti-fuse arrays by providing a high density, low voltage anti-fuse cell structures suitable for standard CMOS manufacturing process.

In a first aspect, the present invention provides an anti-fuse transistor formed on a semiconductor material. The anti-fuse transistor includes a polysilicon gate, a diffusion region, and a variable thickness gate oxide. The polysilicon gate is formed over a channel region in a substrate, the channel having a preset length. The diffusion region is proximate to one end of the channel region. The variable thickness gate oxide is located between the polysilicon gate and the substrate, such that the variable thickness gate oxide has an oxide breakdown zone fusible to form a conductive channel between the polysilicon gate and the channel region. A thicker portion of the variable thickness gate oxide is adjacent to the diffusion region.

According to an embodiment of the present aspect, the variable thickness gate oxide can include a thick gate oxide between the substrate and the polysilicon gate, and a thin gate oxide between the substrate and the polysilicon gate. The thick gate oxide extends from the one end of the channel region to a predetermined distance of the preset length, and the thin gate oxide extends from the predetermined distance to a second end of the channel region, where the thin gate oxide includes the oxide breakdown zone. The anti-fuse transistor can include a floating diffusion region proximate to the thin gate oxide, and the floating diffusion region can be adjacent to the thin gate oxide.

In further embodiments of the present aspect, the thin gate oxide can be identical to at least one low voltage transistor gate oxide formed on the semiconductor material and the thick gate oxide can be identical to at least one high voltage transistor gate oxide formed on the semiconductor material. The thick gate oxide can be a combination of an intermediate gate oxide and the thin gate oxide.

According to aspects of the present embodiments, the floating diffusion area, the second end of the channel region and a gate edge of the polysilicon gate have a common edge defined by at least two line segments being at an angle to each other, where the angle can be either 135 degrees or 90 degrees. The diffusion region can include an LDD implant identical to the LDD implant of one of a low voltage transistor, a high voltage transistor, or a combination of both the low and high voltage transistors. An edge of the diffusion region and a portion of the polysilicon gate can be free of salicidation.

In a second aspect, the present invention provides an anti-fuse memory array. The anti-fuse memory array includes a plurality of anti-fuse transistors arranged in rows and columns, bitlines and wordlines. Each anti-fuse transistor can include a polysilicon gate, a diffusion region, and a variable thickness gate. The polysilicon gate is located over a channel region in a substrate, where the channel has a preset length. The diffusion region is proximate to one end of the channel region. The variable thickness gate oxide is located between the polysilicon gate and the substrate, the variable thickness gate oxide having an oxide breakdown zone fusible to form a conductive channel between the polysilicon gate and the channel region. A thicker portion of the variable thickness gate oxide is adjacent to the diffusion region. The bitlines are coupled to the diffusion regions of a column of anti-fuse transistors, and the wordlines are coupled to the polysilicon gates of a row of anti-fuse transistors.

In an embodiment of the present aspect, the variable thickness gate oxide can include a thick gate oxide between the substrate and the polysilicon gate and a thin gate oxide between the substrate and the polysilicon gate. The thick gate oxide extends from the one end of the channel region to a predetermined distance of the preset length, while the thin gate oxide extends from the predetermined distance to a second end of the channel region. The thin gate oxide includes the oxide breakdown zone. The anti-fuse memory array can further include a sense amplifier coupled to a pair of bitlines through isolation devices, and wordline decoding circuitry. The column select pass gates can have a gate oxide that is the same as the thick gate oxide.

In one aspect of the present embodiment, the wordline decoding circuitry selectively accesses one anti-fuse transistor coupled to one of the pair of bitlines for a single-ended sensing operation, and selectively accesses another anti-fuse transistor coupled to the other of the pair of bitlines for a different address. In another aspect of the present embodiment, the wordline decoding circuitry selectively accesses one anti-fuse transistor coupled to one of the pair of bitlines and one anti-fuse transistor coupled to the other of the pair of bitlines for a dual-ended sensing operation.

In a third aspect, the present invention provides a method of forming a variable thickness gate oxide for an anti-fuse transistor. The method includes growing an intermediate oxide in a channel region of the anti-fuse transistor; removing the intermediate oxide from a thin oxide region of the channel region; and growing a thin oxide over the thin oxide region and the intermediate oxide in the channel region.

In embodiments of the present aspect, the method can include the steps of forming a common gate over the thin and intermediate oxide regions, forming a diffusion region adjacent the intermediate oxide, and forming a floating diffusion region adjacent the thin oxide region. The method can further include the steps of selectively growing a salicidation protect oxide over the diffusion region, and saliciding a portion of the polysilicon gate and the floating diffusion region.

In a fourth aspect, the present invention provides an anti-fuse transistor formed on a semiconductor material. The anti-fuse transistor includes an active area, a polysilicon gate, a thick gate oxide, a diffusion region and a thin gate oxide. The polysilicon gate is formed over the active area to define a fusible edge and an access edge. The thick gate oxide is adjacent to the access edge and the diffusion region is adjacent to the access edge. The thin gate oxide is adjacent to the fusible edge, the thin gate oxide having a lower breakdown voltage than the thick gate oxide for forming a conductive channel between the polysilicon gate and the diffusion region.

In an embodiment of the present aspect, the fusible edge is longer than the access edge, where a length of the fusible edge is defined by at least two line segments of the polysilicon gate being at an angle to each other or the length of the fusible edge is defined by a width of the active area. In another embodiment of the present aspect, the polysilicon gate defines a channel region between the fusible edge and the access edge, and the thick gate oxide and the thin gate oxide are disposed between the channel region and the polysilicon gate. The thick gate oxide can extend from the access edge to a predetermined length of the channel region, and the thin gate oxide can extend from the predetermined length of the channel region to the fusible edge. The thick gate oxide can be a combination of an intermediate oxide and the thin oxide.

In a further embodiments of the present aspect, the thin gate oxide can be identical to a low voltage transistor gate oxide formed on the semiconductor material, the thick gate oxide can be identical to a high voltage transistor gate oxide formed on the semiconductor material, and the polysilicon gate can define a channel region between the fusible edge and the access edge, and the thick gate oxide and the thin gate oxide can be disposed between the channel region and the polysilicon gate. A portion of the polysilicon gate and an edge of the diffusion region are free of salicidation.

In yet a further embodiment, the anti-fuse transistor can include a floating diffusion region adjacent to the fusible edge. The polysilicon gate can have a first portion disposed over the thick gate oxide and located adjacent to the diffusion region for defining a channel region, the access edge being defined by a first portion edge, and a second portion disposed over the thin gate oxide and coupled to the first portion. The fusible edge can be defined by a second portion edge, and the floating diffusion region can be disposed between the fusible edge and the channel region.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 6a and 6b are planar layouts of an alternate anti-fuse transistor according to an embodiment of the present invention;

FIGS. 7a and 7b are planar layouts of an alternate anti-fuse transistor according to an embodiment of the present invention;

FIG. 9 is a flow chart of a method for forming a variable thickness gate oxide for the anti-fuse transistor of the present invention;

FIG. 10a-10c illustrate the formation of the variable thickness gate oxide in accordance with steps of the flow chart of FIG. 9;

DETAILED DESCRIPTION

Generally, the present invention provides a variable thickness gate oxide anti-fuse transistor device that can be employed in a non-volatile, one-time-programmable (OTP) memory array application. The anti-fuse transistor can be fabricated with standard CMOS technology, and is configured as a standard transistor element having a source diffusion, gate oxide, polysilicon gate and optional drain diffusion. The variable gate oxide underneath the polysilicon gate consists of a thick gate oxide region and a thin gate oxide region, where the thin gate oxide region acts as a localized breakdown voltage zone. A conductive channel between the polysilicon gate and the channel region can be formed in the localized breakdown voltage zone during a programming operation. In a memory array application, a wordline read current applied to the polysilicon gate can be sensed through a bitline connected to the source diffusion, via the channel of the anti-fuse transistor. More specifically, the present invention provides an effective method for utilizing split channel MOS structures as an anti-fuse cell suitable for OTP memories.

In the following description the term MOS is used to denote any FET or MIS transistor, half-transistor or capacitor structure.

Figure 1:
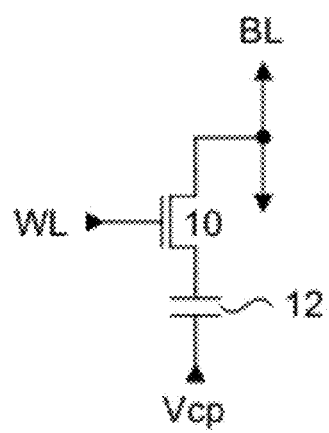
FIG. 1 is a circuit diagram of a DRAM-type anti-fuse cell.
Figure 2:
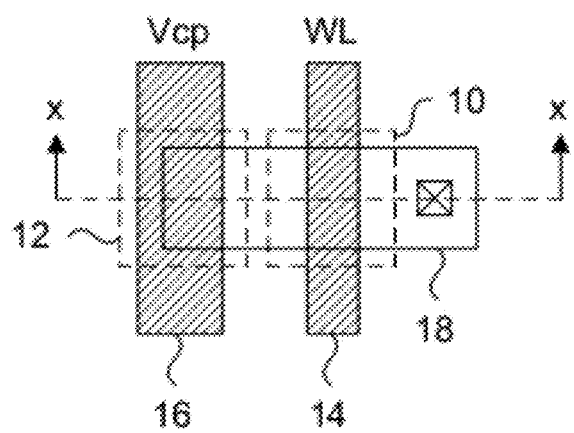
FIG. 2 is a planar layout of the DRAM-type anti-fuse cell of FIG. 1.
Figure 3:
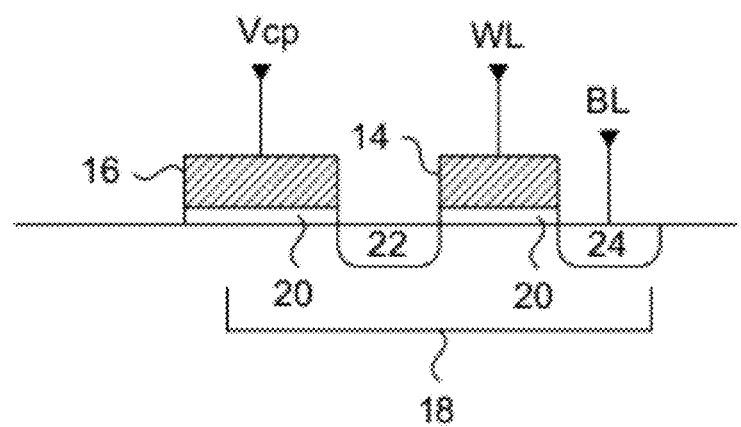
FIG. 3 is a cross-sectional view of the DRAM-type anti-fuse cell of FIG. 2 along line x-x.

As previously discussed, a DRAM-type memory array using a planar capacitors as an anti-fuse instead of as a storage capacitor is already known, as demonstrated in U.S. Pat. No. 6,667,902. FIG. 1 is a circuit diagram of such a memory cell, while FIGS. 2 and 3 show the planar and cross-sectional views respectively, of the known anti-fuse memory cell of FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

Figure 4:
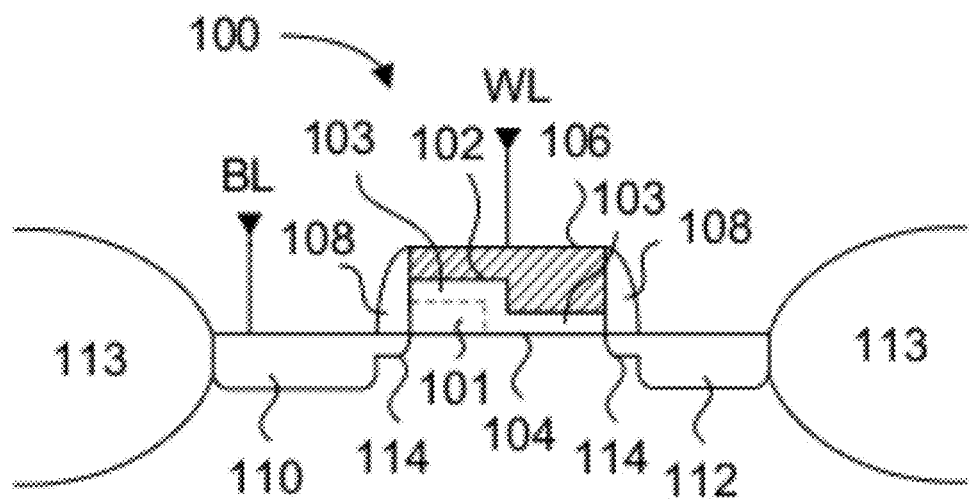
FIG. 4 is a cross-sectional view of an anti-fuse transistor according to an embodiment of the present invention.

According to an embodiment of the present invention, FIG. 4 shows a cross-sectional view of an anti-fuse transistor that can be manufactured with any standard CMOS process. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4 is taken along the channel length of the device, which in the presently described embodiment is a p-channel device. Those of skill in the art will understand that the present invention can be implemented as an n-channel device.

Anti-fuse transistor 100 includes a variable thickness gate oxide 102 formed on the substrate channel region 104, a polysilicon gate 106, sidewall spacers 108, first and second diffusion regions 110 and 112 respectively, and LDD regions 114 in each of the diffusion regions 110 and 112. Field oxide regions 113 are grown adjacent to the diffusion regions 110 and 112, and surrounds the channel region 104 and the diffusion regions 110 and 112, to isolate the anti-fuse transistor 100 from adjacent anti-fuse transistors or other transistor structures. The variable thickness gate oxide 102 consists of a thick oxide and a thin gate oxide 103 such that a portion of the channel length is covered by the thick gate oxide and the remaining portion of the channel length is covered by the thin gate oxide 103. The thick gate oxide includes an intermediate gate oxide 101 between the horizontal dashed line and the channel region 104 and the vertical dashed line and left sidewall spacer 108, and the thin gate oxide 103 between the horizontal dashed line and polysilicon gate 106. Generally, the thin gate oxide edge meeting diffusion region 112 defines a fusible edge where oxide breakdown can occur. The thick gate oxide edge meeting diffusion region 110 on the other hand, defines an access edge where gate oxide breakdown is prevented and current between the gate 106 and diffusion region 110 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In a preferred embodiment, the diffusion region 110 is connected to a bitline through a bitline contact (not shown), or other line for sensing a current from the polysilicon gate 106, and can be doped to accommodate programming voltages or currents. This diffusion region 110 is formed proximate to the thick oxide portion of the variable thickness gate oxide 102, while optional diffusion region 112 can be left floating. To further protect the edge of anti-fuse transistor 100 from high voltage damage, or current leakage, a resistor protection oxide (RPO), also known as a salicide protect oxide, can be introduced during the fabrication process to further space metal particles from the edge of sidewall spacer 108. This RPO is preferably used during the salicidiation process for preventing only a portion of diffusion region 110 and a portion of polysilicon gate 106 from being salicided.

It is well known that salicided transistors are known to have higher leakage and therefore lower breakdown voltage. Thus having the optional diffusion region 112 salicided will enhance oxide breakdown during programming, yet having a non-salicided diffusion region 110 will reduce leakage. Diffusion region 110 and optional diffusion region 112 can be doped for low voltage transistors or high voltage transistors or a combination of the two resulting in same or different diffusion profiles.

Figure 5:
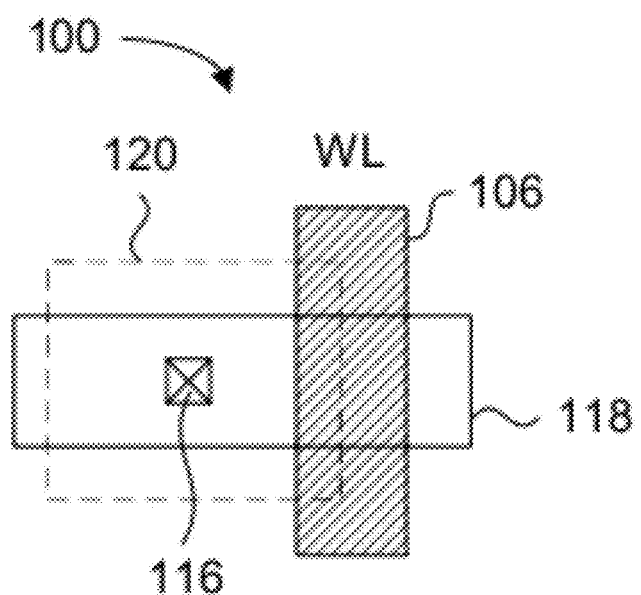
FIG. 5 is a planar layout of the anti-fuse transistor of FIG. 4.

A simplified plan view of the anti-fuse transistor 100 is shown in FIG. 5. Bitline contact 116 can be used as a visual reference point to orient the plan view with the corresponding cross-sectional view of FIG. 4. The active area 118 is the region of the device where the channel region 104 and diffusion regions 110 and 112 are formed, which is defined by an OD mask during the manufacturing process. The dashed outline 120 defines the areas in which the thick gate oxide is to be grown via an OD2 mask during the manufacturing process. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 100 will be discussed later. It should be noted that floating diffusion region 112 is an optional structure for anti-fuse transistor 100 that can be used to enhance the probability of thin gate oxide breakdown, as will be discussed later.

Programming of anti-fuse transistor 100 is based on gate oxide breakdown to form a permanent link between the gate and the channel underneath. Gate oxide breakdown conditions (voltage or current and time) depend primarily on i) gate dielectric thickness and composition, ii) defect density, and iii) gate area, gate/diffusion perimeter. The combined thick and thin gate oxide of anti-fuse transistor 100 results in a locally lowered gate breakdown voltage, in particular an oxide breakdown zone, in the thin gate oxide portion of the device. In otherwords, the disclosed structure assures that the oxide breakdown is limited to the thinner gate oxide portion.

Additionally, the anti-fuse transistor embodiments of the present invention take advantage of a typically prohibited CMOS manufacturing design rule for gate oxide design layout and formation to enhance gate oxide breakdown performance. All gate oxide processing steps in today's CMOS processes assume and are optimized for uniform gate oxide thickness within the active gate area. By introducing the variable thickness gate oxide devices into the standard CMOS flow, additional defects and electrical field disturbances are created at the boundary between the thick and thin gate oxides. Those defects may include, but are not limited to: oxide thinning, plasma etching of silicon at the boundary, residues from cleaning process and silicon recess due to different thermal oxidation rates between unmasked and partially masked regions. All these effects increase trap and defect density at the thin oxide boundary, leading to increased leakage and locally lowered breakdown voltage. Therefore, a low voltage, compact anti-fuse structure can be created without any process modification.

While the anti-fuse transistor described above is suitable for OTP memory array applications due to its compact size, additional modifications can be made to anti-fuse transistor 100 to further increase thin oxide breakdown probability. As mentioned above, gate area, gate/diffusion perimeter is a factor that can increase the probability of thin gate oxide breakdown. To incorporate this breakdown mechanism, the previously shown floating diffusion region 112 can be added to the anti-fuse transistor structure, and the floating diffusion/gate perimeter is preferably increased by incorporating multiple line segments and angles to the diffusion/gate boundary. Further breakdown enhancement can be achieved by heavily doping floating diffusion region 112 to a concentration similar to diffusion regions of the high voltage transistors.

In a typical CMOS process, the diffusion regions, LDD and channel implantation are different for thin gate oxide transistors and thick gate oxide transistors. According to an embodiment of the present invention, the diffusion regions, LDD and the thin gate oxide channel implantation of the anti-fuse transistors can be either type; the low voltage type corresponding to the thin gate oxide, or the high voltage type corresponding to the thick gate oxide (I/O oxide), or both, provided that the resulting thin gate oxide threshold voltage is not greater in magnitude than the thick gate oxide threshold voltage.

Figure 8:
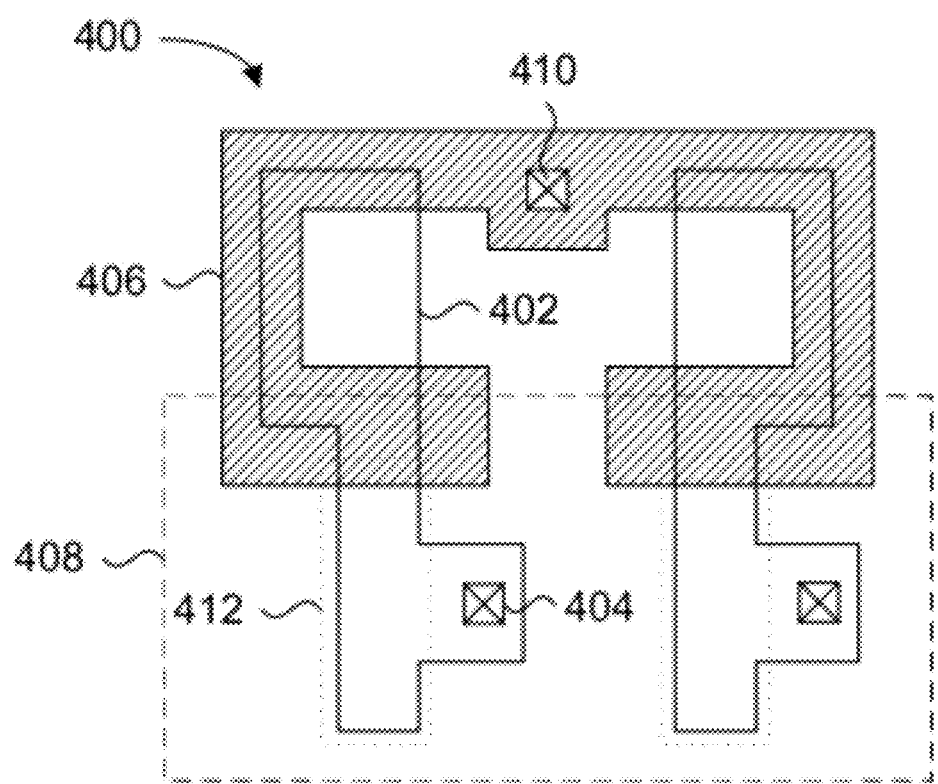
FIG. 8 is a planar layout of an alternate anti-fuse transistor according to an embodiment of the present invention.

Embodiments of the anti-fuse transistor employing increased floating diffusion region perimeter are shown in FIGS. 6-8.

FIG. 6a shows an anti-fuse transistor 200 having an "L" shaped gate/diffusion perimeter, also referred to as the fusible edge, at the floating diffusion end of the device. Anti-fuse transistor 200 is essentially the same as anti-fuse transistor 100 shown in FIGS. 4 and 5. An active region 202 has a diffusion region with bitline contact 204, and a polysilicon gate 206 formed over a variable thickness gate oxide layer (not shown). The OD2 mask 208 defines where the thick gate oxide is formed underneath polysilicon gate 206. In the present embodiment, the floating diffusion region, channel region, and polysilicon gate share a common "L" shaped edge. The edge consists of two edge segments 209 oriented at an angle with respect to each other. While the presently shown embodiment shows the angle to be about 90 degrees, the angle can be set to 135 degrees if desired.

FIG. 6b shows an anti-fuse transistor 210 having a straight "S" shaped gate/diffusion perimeter, also referred to as the fusible edge, at the floating diffusion end of the device. Anti-fuse transistor 210 is essentially the same as anti-fuse transistor 200 shown in FIG. 6a. An active region 202 has a diffusion region with bitline contact 204, and a polysilicon gate 206 formed over a variable thickness gate oxide layer (not shown). The OD2 mask 208 defines where the thick gate oxide is formed underneath polysilicon gate 206. In the present embodiment, the floating diffusion region, channel region, and polysilicon gate share a common straight "S" shaped edge. The edge consists of three edge segments 209a 209b and 209c oriented at 90 degree angles with respect to each other.

FIGS. 6a and 6b illustrate examples where the polysilicon gate can be shaped to increase the floating diffusion region perimeter. FIGS. 7a and 7b illustrate examples where the diffusion region and/or the polysilicon gate can be shaped to increase the floating diffusion region perimeter.

In FIG. 7a, anti-fuse transistor 300 has a straight gate/diffusion perimeter at the floating diffusion end of the device. A shaped active region 302 has a diffusion region with bitline contact 304, and a polysilicon gate 306 formed in a "U" shape over the shaped active region 302. The OD2 mask 308 defines where the thick gate oxide is formed underneath polysilicon gate 306. Due to the narrowed active region 302, a portion of polysilicon gate 306 will form an access edge 310 that is substantially smaller in perimeter than fusible edge 312 defined by another portion of polysilicon gate 306. In this particular example, the polysilicon gate is effectively divided into two portions that are coupled to each other. The first portion forms a channel in the active area between the diffusion region with bitline contact 304, while the second portion is positioned adjacent to the floating diffusion region. The first portion is formed over thick gate oxide and the second portion is formed over thin gate oxide.

In FIG. 7b, anti-fuse transistor 314 has a straight gate/diffusion perimeter at the floating diffusion end of the device. A shaped active region 302 has a diffusion region with bitline contact 304, and a straight polysilicon gate 306 formed over the shaped active region 302. The OD2 mask 308 defines where the thick gate oxide is formed underneath polysilicon gate 306. Due to the narrowed active region 302, a portion of polysilicon gate 306 will form an access edge 310 that is substantially smaller in perimeter than fusible edge 312 defined by another portion of polysilicon gate 306.

Therefore, as shown in FIGS. 6a, 6b, 7a and 7b, the perimeter fusible edge can be increased with a combination of polysilicon gate and active area shaping to enhance thin oxide breakdown during programming operations.

FIG. 8 shows a pair of anti-fuse transistors, of which only one will be described as both are substantially symmetrical to each other. Anti-fuse transistor 400 has an active region 402 with a diffusion region with bitline contact 404. A polysilicon gate 406 formed over a variable thickness gate oxide layer (not shown). The OD2 mask 408 defines where the thick gate oxide is formed underneath polysilicon gate 406. In the present embodiment, the floating diffusion region, channel region, and polysilicon gate share a common straight "U" shaped edge. A polysilicon contact 410 is used to make electrical contact with a metal wordline. The diffusion region containing the bitline contacts 404 are oriented as shown to allow for sufficient spacing of RPO 412 from the respective contacts 404. The applicability of the paired anti-fuse transistors shown in FIG. 8 will be described later with regards to folded bitline sensing architectures.

While not shown in FIGS. 6a, 6b, 7a and 7b, an RPO can be used to ensure that the diffusion regions with the bitline contact and a portion of the polysilicon gate is free from salicidation.

A method of creating a variable thick gate oxide from a standard CMOS process according to an embodiment of the present invention, is to utilize a well known two-step oxidation process. A flow chart outlining this process is shown in FIG. 9, while FIGS. 10a-10c show the various stages of the variable thickness gate oxide formation corresponding to specific steps in the process.

First, an intermediate gate oxide is grown in all active areas determined by the OD mask in step 500. In FIG. 10a, this is shown as the formation of intermediate gate oxide 600 on the substrate, over the channel region 602. In following step 502, the intermediate gate oxide 600 is removed from all the designated thin gate oxide areas using an OD2 mask. FIG. 10b shows the remaining portion of intermediate gate oxide 600 and the future thin oxide area 604. In the last gate oxide formation step 504, a thin oxide is grown again in all active areas as originally defined by the OD mask. In FIG. 10c, the thin gate oxide 606 is grown over the intermediate gate oxide 600 and the thin oxide area 604.

As a result, the area covered by the OD2 mask during step 502 will have a gate oxide thickness being a combination of the intermediate gate oxide 600 and the final thin gate oxide 606. The same procedure can be extended for more than two oxidation steps, or other equivalent procedures can be used to produce two or more gate oxide thicknesses on the same die, which is determined by at least one thick gate oxide mask OD2.

Typically, the OD2 mask is considered a non-critical masking step, a low resolution mask is used and the design rules require a large margin of the OD2 mask over active gate areas and particularly, do not have provisions for the OD2 mask ending within the active gate area. According to the present invention, the OD2 mask ends within the active gate area creating a split-channel anti-fuse structure that features thicker gate oxide on the drain (i.e. diffusion contact) side and thinner gate oxide on the opposite side (either channel or non-connected source side). In principle, this technology requires that the gate length (polysilicon line width) should be larger then the process minimum and depends on actual OD2 mask tolerances, but otherwise does not require any process or mask grade change. The minimum gate length for the split channel anti-fuse structure can be approximated as a sum of minimum gate length for the thick and thin gate oxide. Those skilled in the art will appreciate that accurate calculations can be made based on mask tolerances, and the gate length can be minimized by tightening OD2 mask tolerances.

Once the variable thickness gate oxide has been formed, additional standard CMOS processing steps can be employed at step 506 to complete the anti-fuse transistor structure as shown in FIG. 4. This can include formation of the polysilicon gate, LDD regions, sidewall spacers, RPO, and diffusion regions, and salicidation, for example. According to a preferred embodiment of the presently discussed process, a salicidiation step is included to salicide the polysilicon gate and the floating diffusion region of the anti-fuse transistor. An RPO is formed over the diffusion region before hand to protect it from the salicidation process. As previously mentioned, the salicided floating diffusion region will enhance oxide breakdown in the region.

Figure 10D:
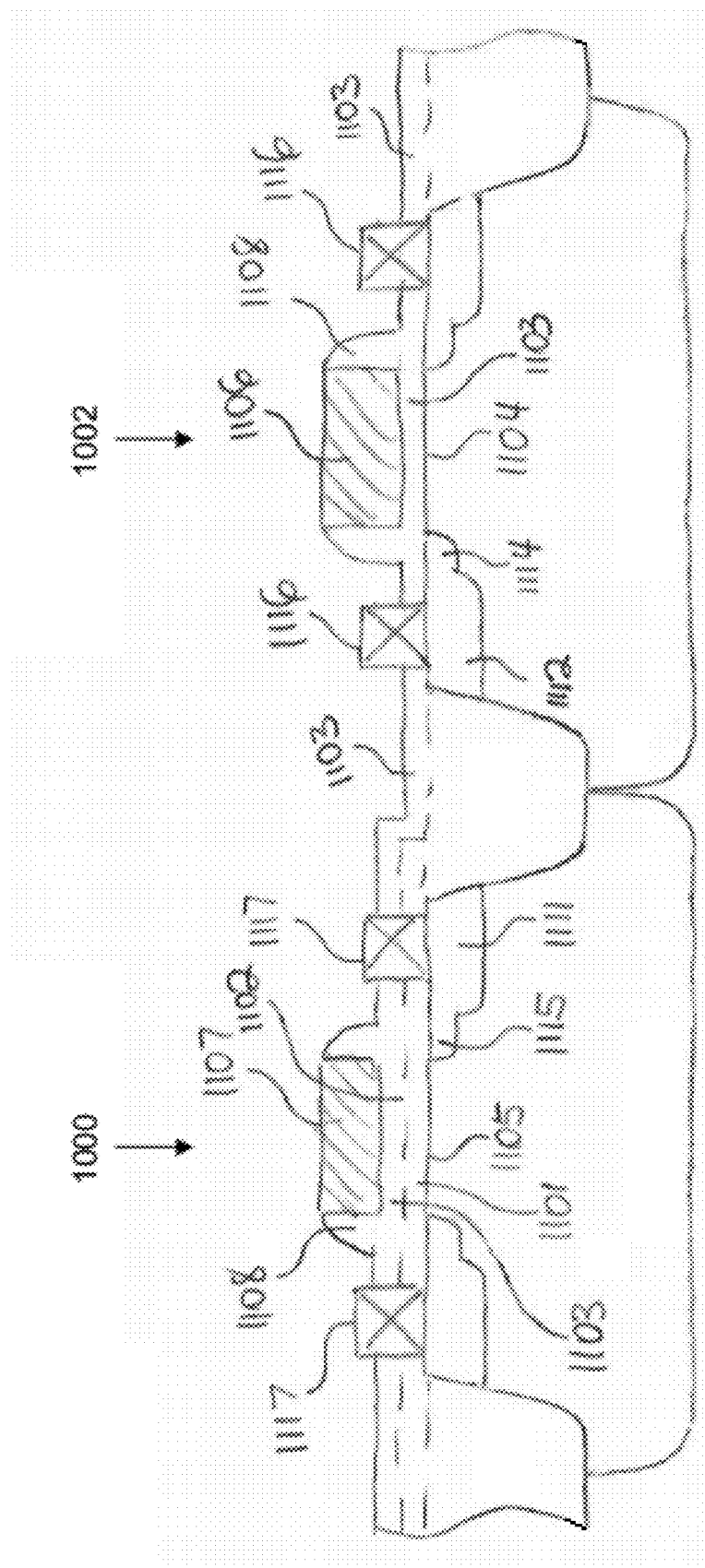
FIG. 10d is a cross-sectional view of a high voltage transistor and a low voltage transistor.

FIG. 10d is a cross-sectional view showing a high voltage transistor and a low voltage transistor having thick and thin gate oxides respectively. High voltage transistor 1000 includes first and second diffusion regions 1111 with respective LDD regions 1115, optional contacts 1117 electrically connected to diffusion regions 1111, a polysilicon gate 1107 formed over the channel 1105 with its own sidewall spacers 1108. Between the polysilicon gate 1107 and channel 1105 is a thick gate oxide 1102, which is composed of an intermediate gate oxide layer 1101 formed on the channel 1105, and a thin gate oxide layer 1103 formed on the intermediate gate oxide layer 1101. Low voltage transistor 1002 includes first and second diffusion regions 1112 with respective LDD regions 1114, optional contacts 1116 electrically connected to diffusion regions 1112, a polysilicon gate 1106 formed over the channel 1104 with sidewall spacers 1108. Between the polysilicon gate 1106 and channel 1104 is the thin gate oxide 1103.

Now an application of the above-described anti-fuse transistor embodiments will be discussed. As mentioned earlier, the compactness of the proposed anti-fuse transistor makes it suitable for memory array applications, and more specifically, OTP memory array applications.

Figure 11A:
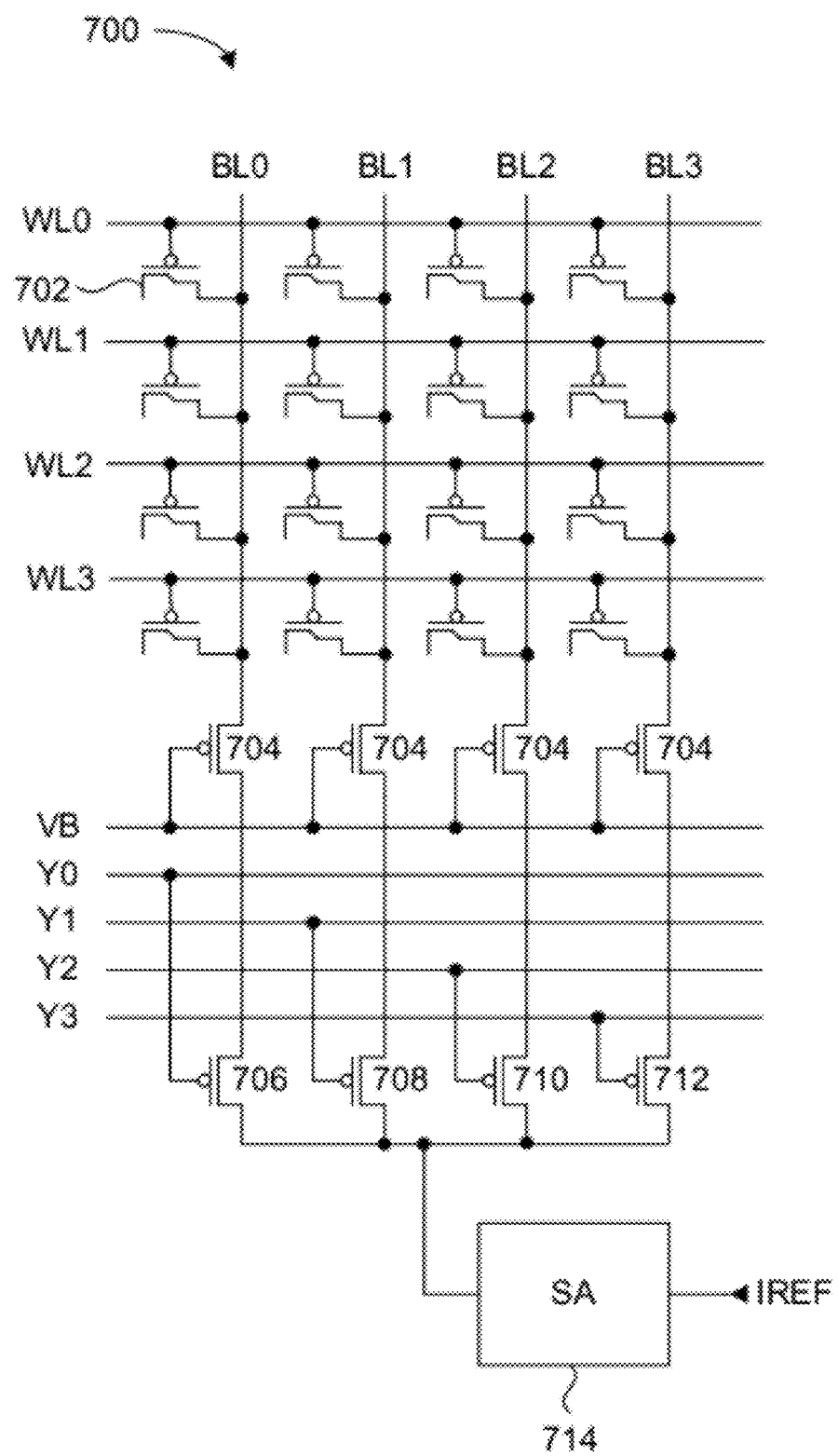
FIG. 11a is a cross-point configured anti-fuse transistor memory array configured for single-ended sensing according to an embodiment of the present invention.

FIG. 11a illustrates a plurality of anti-fuse transistor memory cells arranged in a basic cross-point array, according to an embodiment of the present invention. Sensing is single ended in the present embodiment. The anti-fuse transistor memory array 700 includes anti-fuse transistors 702 coupled to wordlines WL0-WL3 and bitlines BL0, BL1, BL2 and BL3. Anti-fuse transistors 702 can be implemented with any of the previously described anti-fuse transistors. Each bitline is connected to a p-channel isolation transistor 704, which in turn is connected to thin gate oxide p-channel pass gates 706, 708, 710 and 712. It is noted that isolation transistors 704 are thick gate oxide transistors, where this thick gate oxide can be the same combination of the intermediate oxide and the thin gate oxide used for the anti-fuse transistor embodiments of the present invention. The gate terminal of all isolation transistors 704 receive isolation voltage VB, while the gate terminals of pass gates 706, 708, 710 and 712 receive column select signals Y0, Y1, Y2 and Y3 respectively. The column select signals perform a one of four bitline selection to couple one of the bitlines to cross-point sense amplifier 714. Cross-point sense amplifier 714 can be a current sense amplifier that compares the current of the bitline to a reference current IREF, and generally denotes single-ended sensing schemes in the present description, where a bitline voltage or current is compared to a reference signal carried on another line.

FIG. 11c is a cross-sectional view showing a high voltage transistor and a low voltage transistor having thick and thin gate oxides respectively. High voltage transistor 1000 includes first and second diffusion regions 1111 with respective LDD regions 1115, optional contacts 1117 electrically connected to diffusion regions 1111, a polysilicon gate 1107 formed over the channel 1105 with its own sidewall spacers 1108. Between the polysilicon gate 1107 and channel 1105 is a thick gate oxide 1102, which is composed of an intermediate gate oxide layer 1101 formed on the channel 1105, and a thin gate oxide layer 1103 formed on the intermediate gate oxide layer 1101. Low voltage transistor 1002 includes first and second diffusion regions 1112 with respective LDD regions 1114, optional contacts 1116 electrically connected to diffusion regions 1112, a polysilicon gate 1106 formed over the channel 1104 with sidewall spacers 1108. Between the polysilicon gate 1106 and channel 1104 is the thin gate oxide 1103.

Figure 12:
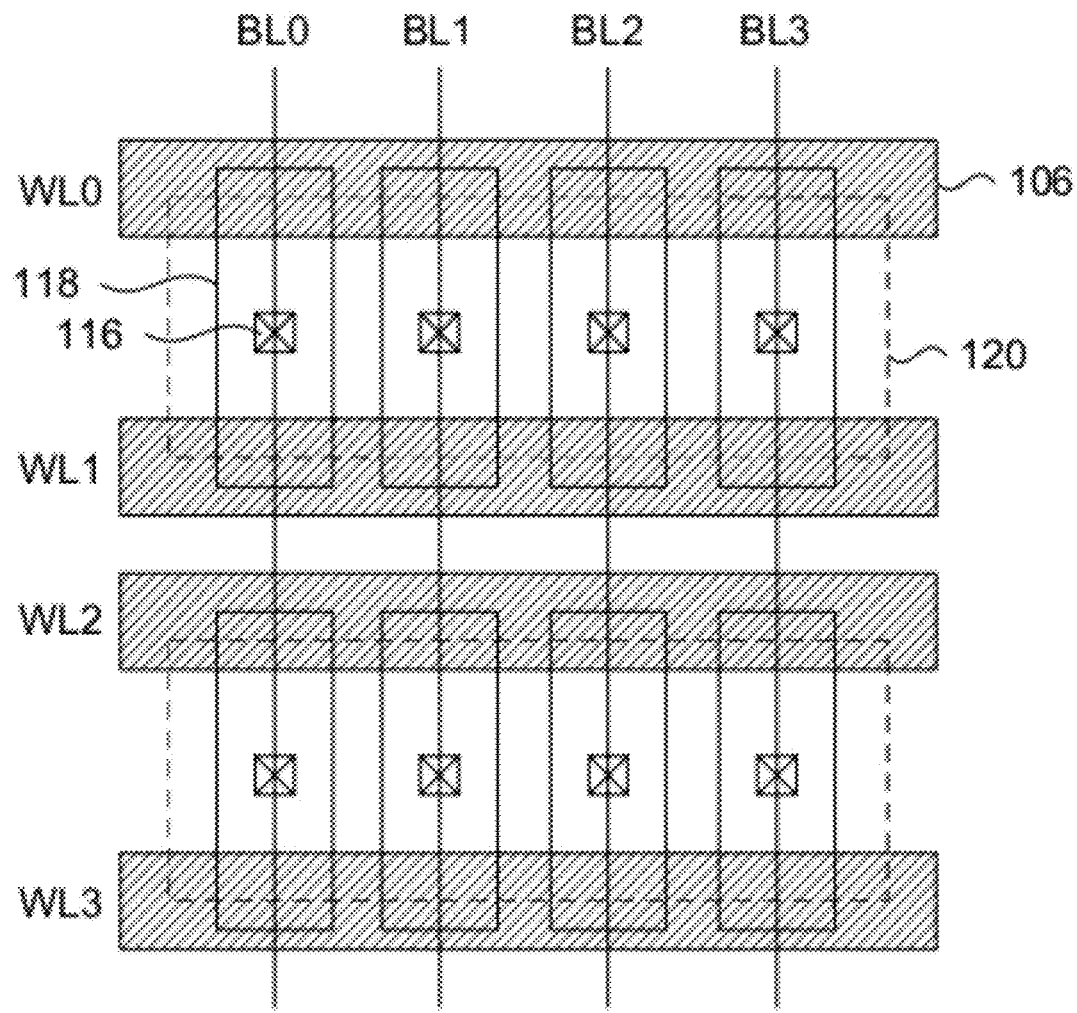
FIG. 12 is a layout of the anti-fuse transistors of the memory array shown in FIGS. 11a and 11b.

FIG. 12 illustrates a layout configuration of four anti-fuse transistors 702 shown in FIG. 11a. Each anti-fuse transistor of FIG. 12 have a layout similar to anti-fuse transistor 100 shown in FIG. 5, except that there is no floating source diffusion region to reduce the overall area of each cell. Accordingly, the same reference numerals are used to denote the same elements in FIG. 12. For the memory array configuration shown in FIG. 12, each bitline contact 116 and active area 118 is shared by two anti-fuse transistors, and the OD2 mask 120 is extended along the wordline direction for all the anti-fuse transistors aligned along the same row.

The anti-fuse transistors are programmed by rupturing the gate oxide, preferably at one of the thin/thick gate oxide boundary and the thin gate oxide/source diffusion edge. This is accomplished by applying a high enough voltage differential between the gate and the channel of the cells to be programmed and a substantially lower voltage differential, if any, on all other cells. Therefore, once a permanent conductive link is formed, a current applied to the polysilicon gate will flow through the link and the channel to the diffusion region, which can be sensed by conventional sense amplifier circuits.

With reference to FIG. 11a, the cell coupled to WL0 and BL0 is programmed by applying a negative voltage −VPP to WL0 and a positive voltage VPOS (or VDD) to BL0, while keeping the other wordlines at VDD and the other bitlines at 0V or another voltage significantly smaller then VPOS. This will expose the cell to be programmed to a voltage differential of V=VPOS+VPP, while all the other cells will be exposed to significantly lower voltage. Note that a positive programming voltage VPOS has to be applied to the cell to be programmed, but once programmed this cell would read as a low state. Either individual cell or multiple cells sharing the same word line can be programmed simultaneously. Although programming circuitry is not shown, those of skill in the art will understand that such circuits can be coupled to the bitlines, and incorporated into the wordline driver circuits.

Once a cell in a row has been programmed, every time the negative voltage is applied to this row for programming another cell, a short between this word line and the bit line of the programmed cell will occur pulling this the bit line towards the negative voltage. According to the present invention, the thick gate oxide isolation transistors 704 are used to isolate the bit lines from the rest of the chip, including the sense amplifiers. These devices can be un-decoded or Y-decoded. Keeping the isolation devices at ground or at the VB level allows the bit lines to float towards a negative voltage, thus having no effect on the programming operation. The voltages used for program (PGM) and read operations are summarized in Table 1 below.

TABLE 1

| | | WL | | |
|---|---|---|---|---|
| | | −VPP | VDD | 0 V or −Vtp |
| BL | VDD or VPOS | PGM | No Access | SOAK |
| | Floating or −VPP | PGM Blocked | No Access | No Access |
| | Precharge to VDD | Soft PGM | No Access | READ |

The un-programmed cells behave like switched capacitors, featuring very low leakage current. In the idle (non-accessed) state, all the word lines WL are kept at VDD, at the same level as the back-bias for the array. All the bit lines BL are also precharged to VDD and therefore, there is no leakage and no current flowing anywhere in the array even if some of the cells were programmed. To execute a read operation with memory array 700, one of the word lines is activated, by driving WL0 to 0V for example, or to another appropriate voltage sufficient for inducing a channel underneath the polysilicon gate. If the cell was not programmed, the bit line will see an increased capacitance and minimally increased leakage. On the other hand, if the cell was programmed, a relatively low resistance (500 Ohm-500 kOhm) within the cell will start discharging the bit line towards ground via the grounded WL0. This difference of behaviour can be sensed using a variety of sense amplifier designs known in the art. A simple solution is to use a current sense amplifier, such as well known sense amplifier 714 that is widely used in Flash memories, where the BL current is compared to a reference current. As the anti-fuse ON-resistance can vary significantly from cell to cell, the above-mentioned current sensing scheme requires a very precise current source of about 1 uA. Unfortunately, such small current sensing is slow and susceptible to noise.

One technique to improve the cell current through a programmed anti-fuse is by multiple programming or "soaking" the programmed cell. Cell soaking is widely known and used in non-volatile memory design, either using external programming equipment or an on-chip state machine.

Figure 11B:
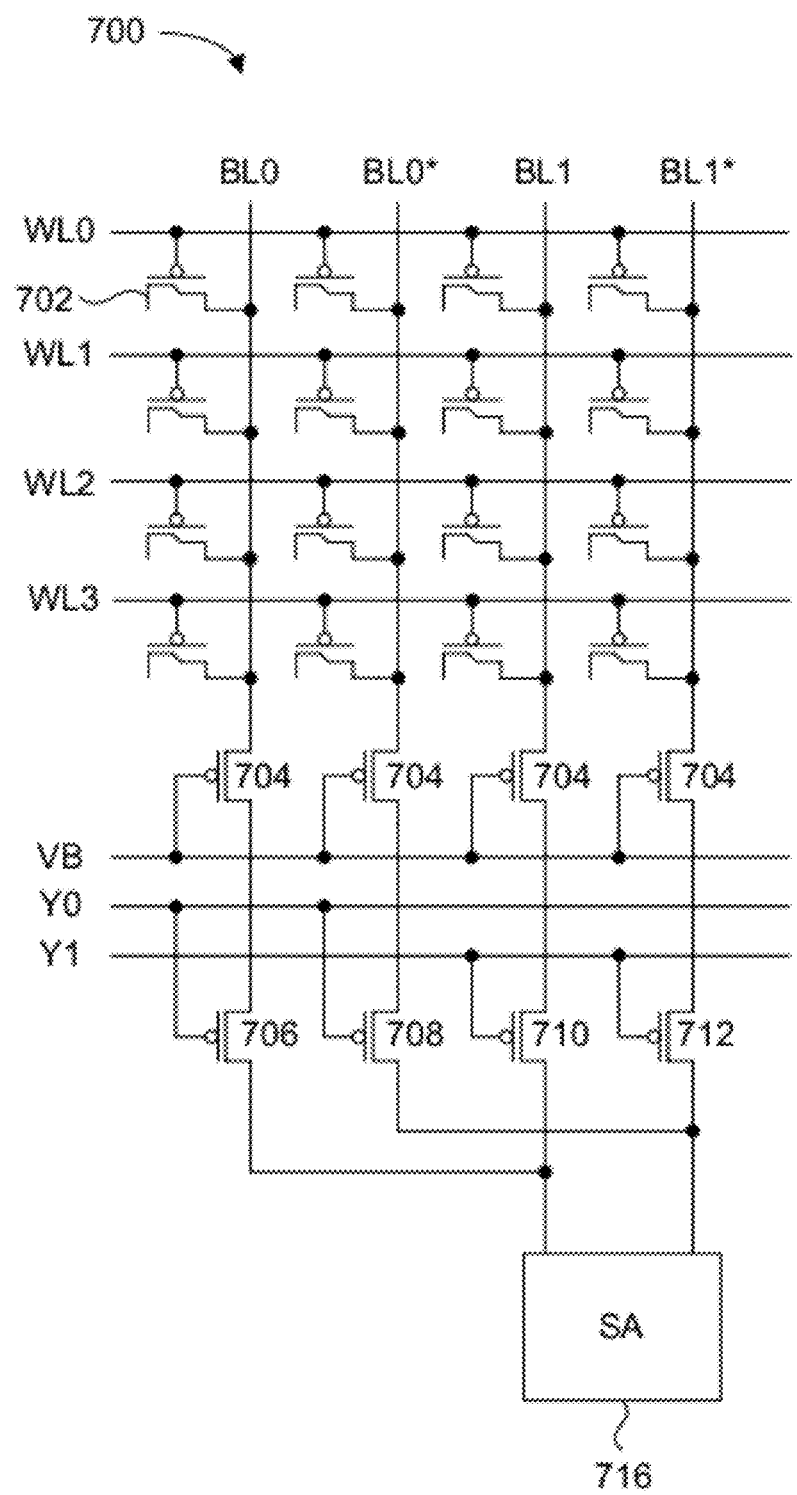
FIG. 11b is a cross-point configured anti-fuse transistor memory array configured for differential sensing according to an embodiment of the present invention.

All these complications can however be avoided by using a differential, or twin cell arrangement, where two memory cells are accessed at the same time with only one cell programmed. Accordingly, data mapping would be required to ensure that each memory cell is paired with a memory cell representing the complementary data. A typical DRAM or SRAM sense amplifier system can be used for such an arrangement. FIG. 11b illustrates another configuration of anti-fuse transistors 702 shown in FIG. 11b arranged in the twin cell configuration. The elements of FIG. 11b are essentially the same as those in FIG. 11a, with the exception of differential sense amplifier 716 which replaces cross-point sense amplifier 714, and the connection of pass gates 706, 708, 710 and 712. Pass gates 706 and 708 now have their gate terminals connected to Y0, while pass gates 710 and 712 have their gate terminals connected to Y1. Therefore, activation of Y0 will turn on both pass gates 706 and 708. The bitlines are now labelled as complementary pairs, BL0/BL0\* and BL1/BL1\*, where one pair of complementary bitlines is coupled to the differential sense amplifier 716 during a read operation. Those of skill in the art will understand that such a sense amplifier is a type of dual-ended sensing scheme, since either one of the bitlines connected to the differential sense amplifier 716 will typically carry a reference voltage while the other will carry data of the accessed memory cell. In the present example, the reference voltage will be the complement of the data of the memory cell being accessed.

Prior to a read operation, all the bitlines are precharged to VDD. Since the bitlines are all precharged to VDD, one of the bitlines will be pulled toward ground through a programmed cell during a read operation when one wordline is activated. Sensing data from a pair of bitlines carrying VDD and ground becomes straightforward.

Although the simple differential sensing scheme seems well suited for read operations of the programmed array, it poses tremendous test problems because the un-programmed memory array yields random and unstable data. In addition, such differential cell arrangement does not provide means for margin adjustment necessary for program verify operation. These and other drawbacks of the above described sensing architectures can be mitigated by employing a folded bitline architecture with a dual ended sensing scheme, as shown in a preferred embodiment in FIG. 13.

Figure 13:
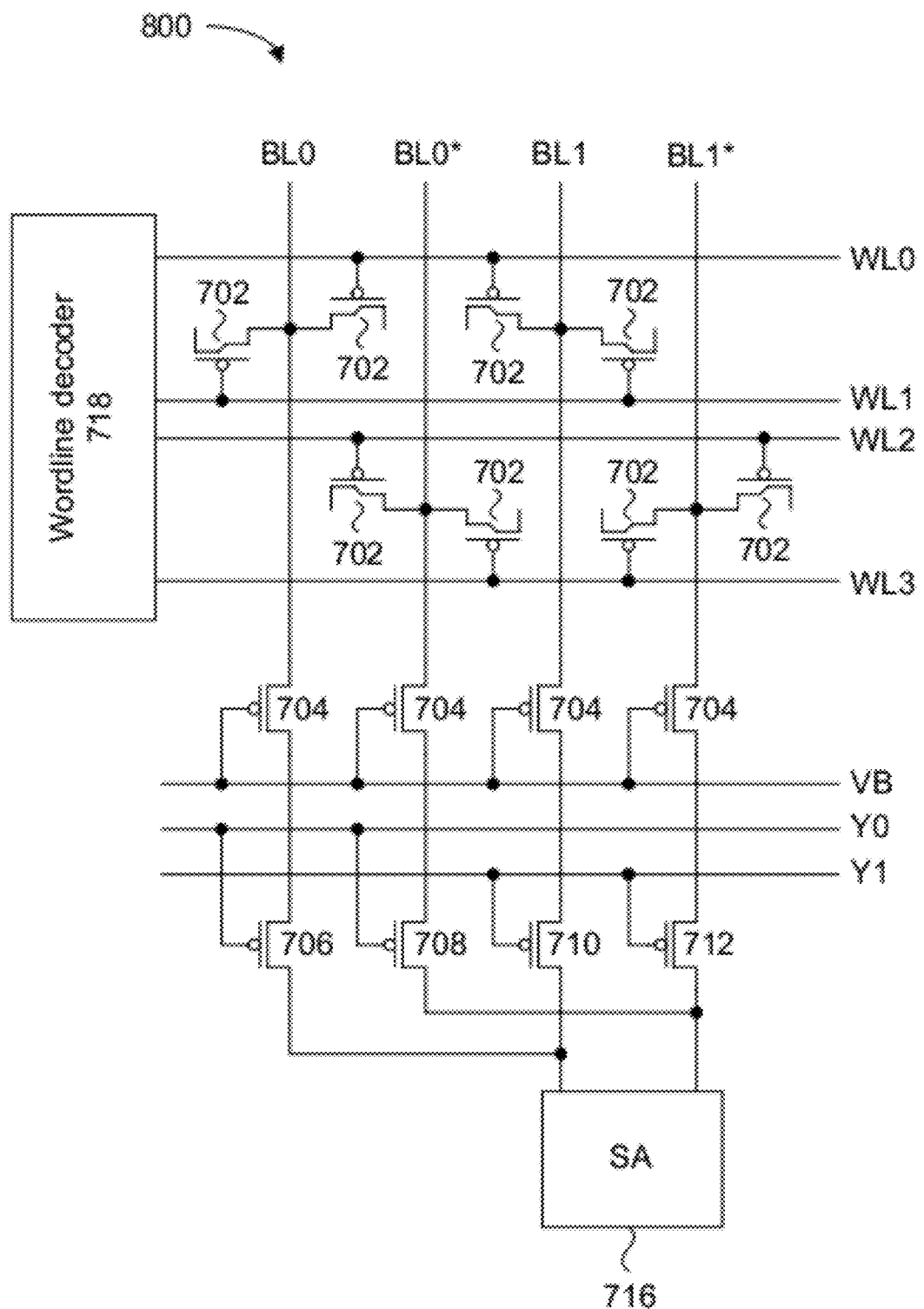
FIG. 13 is a folded bitline configured anti-fuse transistor memory array according to an embodiment of the present invention.

FIG. 13 shows a folded bitline architecture employing the previously described anti-fuse transistors 702. Memory array 800 is similar to memory array 700 of FIG. 11b, except that memory cells 702 are arranged in the folded bitline architecture. FIG. 13 includes a wordline decoder circuit 718 for driving wordlines WL0 to WL3. Those skilled in the art will understand that the decoding circuitry within wordline decoder circuit 718 can include any configuration of logic gates and circuits for driving one wordline in response to a row address.

The following is an example of a read operation of programmed data in memory array 800. It is assumed that the two anti-fuse transistors 702 located between BL0 and BL0\* are used to store one bit of data, where the cell connected to WL0 is not programmed, while the cell connected to WL2 is programmed. To read these two transistor cells, WL0 and WL2 are driven to ground. Since the top cell is not programmed, BL0 will remain at the precharge level of VDD. However, since the bottom cell is programmed, BL0\* will discharge towards ground through the cell. Note that the top and bottom anti-fuse transistor cells between BL1 and BL1\* are also accessed. However, these bitlines are isolated from the sense amplifier since only Y0 would be driven to ground to activate pass transistors 706 and 708 and couple BL0/BL0\* to folded bitline sense amplifier 716. Those of skill in the art will understand that the column select signals Y0 and Y1 can be activated at a predetermined time after the wordlines are driven, to give the bitlines time to discharge to a sufficiently low voltage level, preferably to ground to provide the largest sensing margin.

Figure 14:
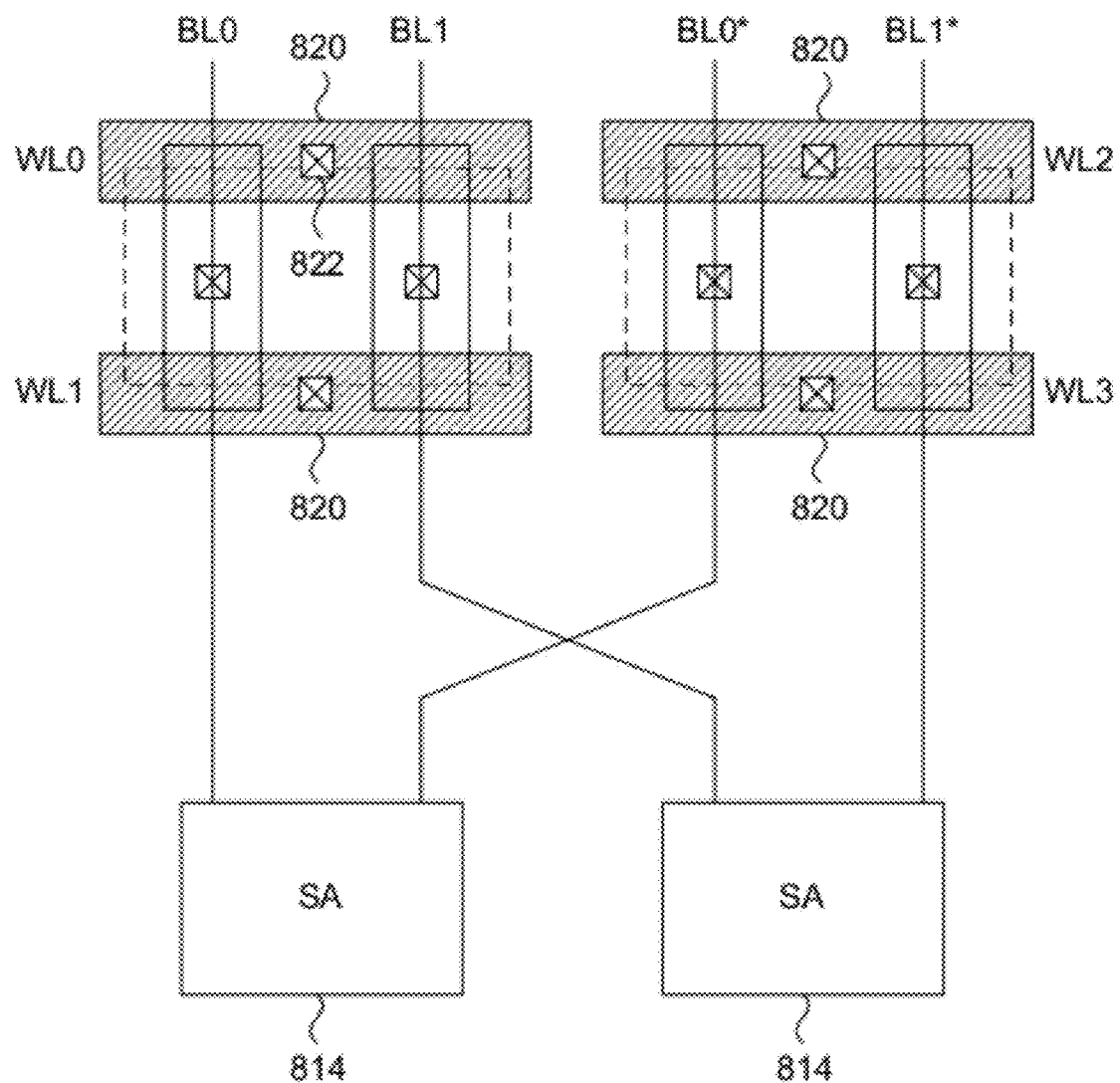
FIG. 14 is a layout of anti-fuse transistors employing wordline segments according to an embodiment of the present invention; and, FIG. 15 is a circuit diagram of a combined sense and programming circuit according to an embodiment of the present invention.

FIG. 14 illustrates an alternate differential cell arrangement according to another embodiment of the present invention. The anti-fuse transistor cells shown are identical to those shown in FIG. 12, but are now arranged such that the polysilicon wordlines are broken into segments 820, where each segment 820 is coupled to two different anti-fuse transistor cells. Alternatively, the anti-fuse transistor pair shown in FIG. 8 can be used here as well. The segments can be connected to metal wordlines through wordline contact 822 via intermediate metal lines as required. It is well known in the art that the combination of metal wordlines connected to polysilicon wordline segments improves overall performance of the memory array. The particular arrangement shown in FIG. 14 enables single-ended sensing or dual-ended sensing of the bitlines by configuring the wordline decoders. In other words, the wordline drivers can be controlled dynamically to drive only one wordline or two wordlines simultaneously in similar fashion to the DRAM decoder shown in issued U.S. Pat. No. 6,549,483. In the current application however, the single ended mode is used for a non-volatile memory cell test, and program and verify operations, whereas the dual ended mode is used for normal read operations only. Such a combination allows for independent sensing optimization for read, test and verify, resulting in greatly improved read margins. The details of the single ended sensing mode will be described later.

Figure 15:
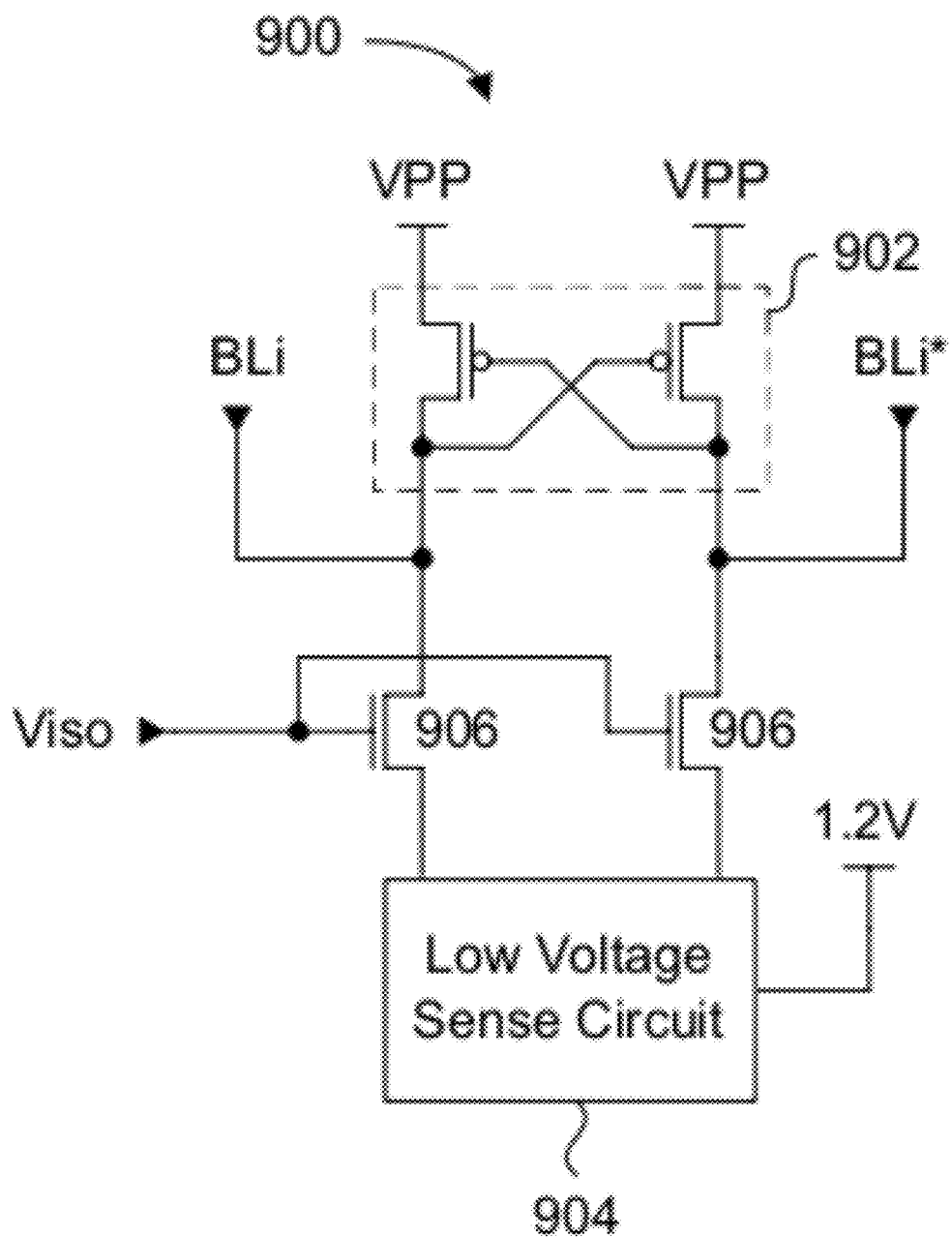

According to an embodiment of the present invention, programming circuits can be incorporated with the sensing circuit of the differential sense amplifier circuit. FIG. 15 is a circuit diagram of an embodiment of such a circuit for n-type antifuse. Sense/program circuit 900 includes a high voltage cross-coupled p-type latch circuit 902 and a low voltage sense circuit 904 separated by thick gate oxide isolation transistors 906 controlled by Viso. Viso is preferably a variable voltage signal, such that Viso can be less than VDD for data verification after programming to limit current draw. The cross-coupled latch circuit 902 receives VPP or another program blocking voltage, and each branch of the latch circuit 902 is connected to a complementary pair of biltines BLi/BLi*, while the sense circuit 904 receives a 1.2V supply voltage. Viso is preferably set to a maximum voltage level of about VDD+Vt=1.8V to isolate the more sensitive sense circuit transistors from the VPP voltage.

In a programming operation, sense circuit 904 receives write data, which is coupled to latch circuit 902 via activated isolation transistors 906. Latch circuit 902 effectively performs a level shift of the 1.2V data to VPP, which is then driven onto the appropriate bitline. Furthermore, during read operation the back bias connection is preferably maintained at a high voltage, while the supply voltage is kept at or below VDD to turn off the high voltage PMOS transistors at all times.

As was mentioned earlier, the prior art sensing methods allow for reliable sensing of the anti-fuse memory array according to the present invention, but testing of the un-programmed array is compromised and testing of the OFF- and ON-resistance is difficult. Therefore there is a need for an improved and more compact sensing and testing method.

This is accomplished in the present invention by a new OTP-DRAM sensing scheme, as it would be applied to n-type anti-fuse transistor embodiments of the present invention. In addition to the regular OTP memory array, one or more rows, and if needed one or more columns of DRAM reference cells are added. These cells are used as short term DRAM memory for testing row and column decoders. In addition, the DRAM cells can be precharged to a tightly controlled voltage (either external or internally generated) and activated in parallel with the OTP cells either on the true or on the complementary bit line, allowing for very precise control of additional charge injected to the bit lines during the sense operation. A typical DRAM differential sense technique is used. For example, the bitlines are precharged to VDD and the DRAM cells are precharged to a reference voltage level such as VSS. Next, two word lines are activated, one OTP word line and one DRAM word line. Assuming the bitlines are balanced, a negative charge is injected from the DRAM cell to the complementary bitline and the OTP cell is connected to the true bitline. If the OTP cell was not programmed, the true bit line will remain positively charged and will be sensed as such by the sense amplifier. But if the cell was programmed, the true bit line will be discharged towards ground and sensed as low. Controlling the amount of charge in the DRAM cell and the time for bitline evaluation allows for precise testing of the relative resistance of the cell, whether it is programmed or not. It should be noted that this method can be used for single ended OTP read, or for margining the dual ended OTP read. The retention of DRAM cells is not essential for the basic read operations and should not affect memory yield. The DRAM reference cells according to present invention are preferably included within the OTP memory array for enhanced testing capability.

Alternately, instead of using DRAM cells, the true bitline capacitance can be increased. This can be done "for free" in a cross-point array architecture where the Y-decoder can connect just a single bitline to the differential sense amplifier. For stability, the other node of the sense amplifier should be connected to a small capacitor, called a stability capacitor. This stability capacitor is preferably chosen such that if the cell is not programmed, the sense amplifier will always be skewed to flip in one direction. However, if the cell is programmed and the bitline is discharged to a certain level, the sense amplifier will flip in the opposite direction.

The previously described embodiments of the anti-fuse transistor can be fabricated using standard CMOS processes, where its specific structures can be formed by simple mask manipulation. Accordingly, the above-described anti-fuse transistors and memory array can be manufactured at low cost either as p-type or n-type antifuses.

While the embodiments of the present invention are described with respect to single polysilicon gate anti-fuse transistor cells, the aforementioned teachings can apply to metal gate devices, and dual-gate structures similar to that shown in FIGS. 2 and 3. In such an embodiment, the gate 14 would be formed over a thick gate oxide portion, while top plate 16 would be formed over a thin gate oxide portion. Oxide breakdown is enhanced through the previously discussed techniques, such as high voltage diffusion doping and salicidation with RPO formation. Accordingly, the fusible edge would be located at the common edge of the thick gate oxide under top plate 16 and diffusion region 22, while the access edge would be located at the common edge of the thin oxide under gate 14 and diffusion region 24.

Those skilled in the art will understand that the invention equally applies to all other bulk MOS, thin film and SOI technologies including DRAM, EPROM, EEPROM and Flash, using either SiO2 or other gate dielectrics. Furthermore, persons of skill in the art can easily adopt the previously described p-channel devices to n-channel devices, either using isolated p-well and negative bias, or utilizing positive voltages only.

The anti-fuse structures of present invention can be utilized in all one time programmable applications, including RF-ID tags. RF-ID tagging applications are gaining more acceptance in the industry, particularly in sales, security, transport, logistics, and military applications for example. The simplicity and full CMOS compatibility of the presently described anti-fuse transistor invention allows for application of the RF-ID tag concept to integrated circuit manufacturing and testing process. Therefore, IC manufacturing productivity can be increased by utilizing the split-channel anti-fuse tag in combination with an RF communication interface on every wafer and/or every die on the wafer allowing for contact-less programming and reading chip specific or wafer specific information during IC manufacturing and packaging, as well as during printed circuit board assembly.

The above-described embodiments of the present invention are intended to be examples only. Alterations, modifications and variations may be effected to the particular embodi-

What is claimed is:

1. An anti-fuse transistor formed on a semiconductor material-comprising:
   a diffusion region coupled to a first conductor;
   a first gate dielectric proximate to the diffusion region and over a first portion of a channel region surface;
   a second gate dielectric over the first gate dielectric and a second portion of the channel region surface adjacent the first channel region surface, a combined thickness of the second gate dielectric and the first gate dielectric defining a thick gate oxide, and the second gate dielectric over the second portion of the channel region surface defining a thin gate oxide; and,
   a polysilicon gate over the thin gate oxide and the thick gate oxide, the polysilicon gate being coupled to a second conductor.

2. The anti-fuse transistor of claim 1, wherein the thin gate oxide has a thickness corresponding to a gate oxide of a low voltage transistor formed on the semiconductor material.

3. The anti-fuse transistor of claim 2, wherein the thick gate oxide has a thickness corresponding to another gate oxide of a high voltage transistor formed on the semiconductor material.

4. The anti-fuse transistor of claim 3, wherein the thick gate oxide includes a combination of an intermediate gate oxide and the thin gate oxide.

5. The anti-fuse transistor of claim 3, wherein the diffusion region has an LDD implant substantially the same as another LDD implant of one of the low voltage transistor, the high voltage transistor, and a combination of both the low and the high voltage transistors.

6. The anti-fuse transistor of claim 1, wherein the thick gate oxide and the polysilicon gate have a first common edge adjacent to the diffusion region, and the thin gate oxide and the polysilicon gate have a second common edge defined by at least two line segments being at an angle to each other.

7. The anti-fuse transistor of claim 6, wherein the angle is one of 135 degrees and 90 degrees.

8. The anti-fuse transistor of claim 1, wherein an edge of the diffusion region and a portion of the polysilicon gate is free of salicidation.

9. The antifuse transistor of claim 1, where the first conductor is a bitline and the second conductor is a wordline.

10. An anti-fuse transistor formed on a semiconductor material comprising:
    a diffusion region coupled to a first conductor;
    a thin gate oxide over a first portion of a channel region surface, the thin gate oxide consisting of a first gate dielectric having a first thickness;
    a thick gate oxide between the diffusion region and the thin gate oxide, and over a second portion of the channel region surface, the thick gate oxide having a second thickness substantially corresponding to a combined thickness of the first gate dielectric and a second gate dielectric;
    a polysilicon gate over the thin gate oxide and the thick gate oxide, the polysilicon gate being coupled to a second conductor.

11. The anti-fuse transistor of claim 10, wherein the thin gate oxide corresponds to a gate oxide of a low voltage transistor formed on the semiconductor material.

12. The anti-fuse transistor of claim 11, wherein the thick gate oxide corresponds to another gate oxide of a high voltage transistor formed on the semiconductor material.

* * * * *

UNITED STATES PATENT AND TRADEMARK OFFICE
CERTIFICATE OF CORRECTION

Page 1 of 1

PATENT NO. : 8,283,751 B2
APPLICATION NO. : 12/139992
DATED : October 9, 2012
INVENTOR(S) : Wlodek Kurjanowicz It is certified that error appears in the above-identified patent and that said Letters Patent is hereby corrected as shown below:

IN THE SPECIFICATIONS:

Column 14, lines 8 to 25, delete "FIG. 11c is a cross-sectional view showing a high voltage transistor and a low voltage transistor having thick and thin gate oxides respectively. High voltage transistor 1000 includes first and second diffusion regions 1111 with respective LDD regions 1115, optional contacts 1117 electrically connected to diffusion regions 1111, a polysilicon gate 1107 formed over the channel 1105 with its own sidewall spacers 1108. Between the polysilicon gate 1107 and channel 1105 is a thick gate oxide 1102, which is composed of an intermediate gate oxide layer 1101 formed on the channel 1105, and a thin gate oxide layer 1103 formed on the intermediate gate oxide layer 1101. Low voltage transistor 1002 includes first and second diffusion regions 1112 with respective LDD regions 1114, optional contacts 1116 electrically connected to diffusion regions 1112, a polysilicon gate 1106 formed over the channel 1104 with sidewall spacers 1108. Between the polysilicon gate 1106 and channel 1104 is the thin gate oxide 1103."

Signed and Sealed this

Eighteenth Day of December, 2012

David J. Kappos
*Director of the United States Patent and Trademark Office*